(12) United States Patent
Tanabe

(10) Patent No.: US 9,690,189 B2
(45) Date of Patent: Jun. 27, 2017

(54) MASK BLANK SUBSTRATE, MASK BLANK, TRANSFER MASK, AND METHOD OF MANUFACTURING SEMICONDUCTOR DEVICE

(71) Applicant: HOYA CORPORATION, Tokyo (JP)

(72) Inventor: Masaru Tanabe, Tokyo (JP)

(73) Assignee: HOYA CORPORATION, Shinjuku-ku, Tokyo (JP)

( * ) Notice: Subject to any disclaimer, the term of this patent is extended or adjusted under 35 U.S.C. 154(b) by 8 days.

(21) Appl. No.: 14/774,267

(22) PCT Filed: Jun. 19, 2014

(86) PCT No.: PCT/JP2014/066263
§ 371 (c)(1),
(2) Date: Sep. 10, 2015

(87) PCT Pub. No.: WO2014/203961
PCT Pub. Date: Dec. 24, 2014

(65) Prior Publication Data
US 2016/0109797 A1    Apr. 21, 2016

(30) Foreign Application Priority Data
Jun. 21, 2013 (JP) ................................. 2013-130443

(51) Int. Cl.
*G03F 1/50* (2012.01)
*G03F 7/20* (2006.01)
(Continued)

(52) U.S. Cl.
CPC ................ *G03F 1/50* (2013.01); *C03C 15/02* (2013.01); *C03C 17/22* (2013.01); *G03F 1/60* (2013.01); *G03F 7/20* (2013.01); *H01L 21/0274* (2013.01)

(58) Field of Classification Search
CPC ............. G03F 1/50; G03F 7/20; H01L 21/027
See application file for complete search history.

(56) References Cited

U.S. PATENT DOCUMENTS

2002/0105627 A1* 8/2002 Matsuyama ........... G03B 27/68
                                                            355/52
2013/0022900 A1    1/2013 Tanabe

FOREIGN PATENT DOCUMENTS

JP       64-40267 A     2/1989
JP    2002-318450 A    10/2002
(Continued)

OTHER PUBLICATIONS

International Search Report for PCT/JP2014/066263 dated Sep. 16, 2014 English Translation.

*Primary Examiner* — Stephen Rosasco
(74) *Attorney, Agent, or Firm* — Sughrue Mion, PLLC

(57) ABSTRACT

Provided are a mask blank substrate which has effectively and extremely high principal surface flatness while a reduction in the manufacturing throughput of the mask blank substrate is suppressed, a mask blank, and a transfer mask. Also provided are manufacturing methods therefor.
A virtual reference surface that becomes an optically effective flat reference surface defined by a Zernike polynomial which is composed of only terms in which the order of a variable related to a radius is the second or lower order, and includes one or more terms in which the order of the variable related to the radius is the second order is set, and a mask blank substrate satisfying the condition that data (PV value) relating to the difference between the maximum value and the minimum value of the difference data between the reference surface and the measured shape of the mask blank substrate is one-eighth or less of an exposure wavelength (A) is selected.

26 Claims, 27 Drawing Sheets

(51) Int. Cl.
*H01L 21/027* (2006.01)
*G03F 1/60* (2012.01)
*C03C 15/02* (2006.01)
*C03C 17/22* (2006.01)

(56) References Cited

FOREIGN PATENT DOCUMENTS

| | | |
|---|---|---|
| JP | 2004-126010 A | 4/2004 |
| JP | 2004-296939 A | 10/2004 |
| JP | 2007-212219 A | 8/2007 |
| JP | 2008-28388 A | 2/2008 |
| JP | 2010-278034 A | 12/2010 |
| JP | 2013-16710 A | 1/2013 |
| WO | 2011/122608 A1 | 10/2011 |

\* cited by examiner

MASK BLANK SUBSTRATE, MASK BLANK, TRANSFER MASK, AND METHOD OF MANUFACTURING SEMICONDUCTOR DEVICE

CROSS REFERENCE TO RELATED APPLICATIONS

This application is a National Stage of International Application No. PCT/JP2014/066263 filed Jun. 19, 2014, claiming priority based on Japanese Patent Application No. 2013-130443 filed Jun. 21, 2013, the contents of all of which are incorporated herein by reference in their entirety.

TECHNICAL FIELD

This invention relates to a mask blank substrate, a mask blank, and a mask for use in photolithography, and manufacturing methods therefor, and a manufacturing method of a semiconductor device, particularly, a mask blank substrate, a mask blank, a mask, and methods of manufacturing therefor, and a method of manufacturing a semiconductor device that are preferable in securing a focus latitude when photolithography is conducted.

BACKGROUND ART

An increase in NA (high numerical aperture) of exposure apparatus using ArF exposure light of 193 nm wavelength is in progress to deal with the miniaturization of semiconductor devices. A further increase in NA has been made as a result of the introduction of a liquid immersion exposure technique, presently leading to the practical application of NA 1.35.

To deal with such demands for miniaturization and increases in NA, higher flatness of a transfer mask is expected. When the flatness of a mask surface as an object point is reduced, focused position of an image point on a wafer transferred through a projection lens fluctuates. Therefore, reduction in the mask surface flatness causes a decrease in allowable focus latitude. On the other hand, due to the optical principle, an increase in NA of a projection lens reduces focal depth. Therefore, as increases in NA continue, focus latitude in the lithography process decreases, so that there is a demand for high flatness on the mask surface. For this reason, on a transparent substrate used for a mask blank which is an original plate for manufacturing a transfer mask, there is a demand for high flatness on a principal surface to which a thin film is provided for forming a pattern. To deal with the demand for flatness, double-sided polishing for polishing both front and rear faces of a mask blank substrate using a polishing pad such as a polishing fabric and a polishing liquid containing abrasive grains has frequently been used as disclosed in Patent Document 1, for example. However, there is a limitation in increasing flatness of the principal surface of the transparent substrate in its polishing using conventional double side polishing apparatus. Therefore, a technique has been developed in which a shape of a principal surface of a substrate is measured and relatively convex portions are subjected to plasma etching to achieve flatness, as described in Patent Document 2.

Further, there is a problem that the influence of the lens aberration of the projection optical system on transfer accuracy is becoming greater due to a decrease in focus latitude in the lithography process together with an increase in NA of exposure apparatus. To solve this problem, Patent Document 3 discloses two correction optical elements having a surface shape that can be defined by a Zernike polynomial for correcting aberration caused by lens heating effects of a projection optical system.

PRIOR ART DOCUMENTS

Patent Documents

[Patent Document 1]
Japanese Patent Application Publication 1-40267
[Patent Document 2]
Japanese Patent Application Publication 2002-318450
[Patent Document 3]
Japanese Patent Application Publication 2008-028388

SUMMARY OF THE INVENTION

Problem to be Solved by the Invention

There is a demand for high flatness in a mask blank substrate as stated above, and in response thereto, a technical development is occurring for locally processing a principal surface of a transparent substrate. For example, as stated above, Patent Document 2 discloses a technique of manufacturing a mask blank substrate with high flatness by subjecting relatively convex portions to local plasma etching. However, since it is necessary in this method to measure the shape of the principal surface for each substrate to conduct local processing such as plasma etching, there was a problem that throughput is significantly low compared to conventional methods. Further, the exposure apparatus disclosed in Patent Document 3 is for the purpose of correction of lens aberration and controlling a wavefront change of exposure light caused by the history of exposure processing, which requires high flatness of a mask blank and a mask.

The problem to be solved by this invention is to provide a mask blank substrate which has effectively high surface flatness while a reduction in the manufacturing throughput of the mask blank substrates is suppressed, in addition to reducing facility cost of manufacturing devices, a mask blank, a transfer mask, and manufacturing methods therefor. Further, an object of this invention is to manufacture a semiconductor device with a stable circuit operation by securing high transfer accuracy through the use of the transfer mask.

Means for Solving the Problems

To solve the above problem found out by the inventors of this invention, the inventors studied the following points. As mentioned above on the background art, an extremely high flatness is demanded on a principal surface of a mask blank substrate. However, it is extremely difficult to actually manufacture such a completely flat face. Further, while efforts have been made for more flatness by local plasma etching, etc., such a method causes various adverse effects such as low throughput, higher device cost, and generation of foreign matter defects. Therefore, instead of seeking a mechanically flat surface, the inventors changed the idea to seek an optically flat surface, or in other words, to seek an even wavefront flat surface. The inventors found out that what is essentially demanded in image transfer through a projection lens is not always a mechanical plane, but an optically flat surface with an even wavefront. This is the first characteristic point of this invention.

The inventors focused on the fact that a projection lens of an exposure apparatus is provided with aberration correction function for correcting lens aberration. While this function was provided originally for enhancing the performance of an exposure apparatus such as assembling of a lens on an exposure apparatus, setup adjustment, and addressing of chronological change, the inventors came up with the idea that using this function can approximate an optically flat surface to a surface that is polished offset from a mechanically flat surface. This point is the second characteristic point of this invention.

Further, the inventors came up with an idea of using Zernike polynomial approximate surface, which is a polar coordinate system, in describing this optically flat surface. This point is the third characteristic point of this invention.

Moreover, the inventors found out that while aberration correction function of a projection lens can be of a term with higher order where the Zernike polynomial order is third or higher order, when fitting is conducted using a term of higher order, a disadvantage may occur due to a change in high order aberration of the projection lens depending on exposure condition. Furthermore, the inventors found out that the order including only the term of first order is a one-dimensional tilt correction, from which a sufficient optical flatness cannot be obtained. In light of these points, the inventors found out that the order of variable related to a radius is composed only of the terms with second order or less, and that the order of variable related to a radius including one or more terms of second order is effective. This point is the fourth characteristic point of this invention.

As stated above, this invention was made based on the above idea, including the following structures.

(Structure 1)

A mask blank substrate for use in manufacturing a mask blank provided with a thin film for forming a transfer pattern on one of a pair of opposing principal surfaces of a transparent substrate, wherein the principal surface to which the thin film is provided has a surface shape of which, in a case where a shape fitting on a virtual reference surface is carried out and a difference data between the principal surface and the virtual reference surface is obtained in a calculation region within an inner side of a circle of 104 mm diameter based on a center of a substrate, a difference between a maximum height and a minimum height within the calculation region of the difference data is $\lambda/8$ or less, provided that an exposure wavelength used for transfer is $\lambda$, and wherein the virtual reference surface has a shape defined by a Zernike polynomial expressed by a polar coordinate system, which is composed of only terms in which an order of a variable related to a radius is a second or lower order, and includes one or more terms in which an order of a variable related to a radius is a second order.

(Structure 2)

A mask blank substrate for use in manufacturing a mask blank provided with a thin film for forming a transfer pattern on one of a pair of opposing principal surfaces of a transparent substrate, wherein the principal surface to which the thin film is provided has a surface shape of which, in a case where a shape fitting on a virtual reference surface is carried out and difference data between the principal surface and the virtual reference surface is obtained in a calculation region within an inner side of a circle of 90 mm diameter based on a center of a substrate, a difference between a maximum height and a minimum height within the calculation region of the difference data is $\lambda/8$ or less, provided that an exposure wavelength used for transfer is $\lambda$, and wherein the virtual reference surface has a shape defined by a Zernike polynomial expressed by a polar coordinate system, which is composed of only terms in which an order of a variable related to a radius is a second or lower order, and includes one or more terms in which an order of a variable related to a radius is a second order.

(Structure 3)

The mask blank substrate according to Structure 1 or 2, wherein a determination coefficient $R^2$ calculated from the difference data is 0.9 or more.

(Structure 4)

The mask blank substrate according to any of Structures 1 to 3, wherein the principal surface to which the thin film is provided has a flatness of 0.2 µm or less in an inner region of a square shape with a side of 132 mm based on a center of a substrate.

(Structure 5)

A mask blank comprising the thin film on one of principal surfaces of the mask blank substrate according to any of Structures 1 to 4.

(Structure 6)

A mask blank provided with a thin film for forming a transfer pattern on one of a pair of opposing principal surfaces of a transparent substrate, wherein a surface of the thin film has a surface shape of which, in a case where a shape fitting on a virtual reference surface is carried out and difference data between the principal surface and the virtual reference surface is obtained in a calculation region within an inner side of a circle of 104 mm diameter based on a center of a substrate, a difference between a maximum height and a minimum height within the calculation region of the difference data is $\lambda/8$ or less, provided that an exposure wavelength used for transfer is $\lambda$, and wherein the virtual reference surface has a shape defined by a Zernike polynomial expressed by a polar coordinate system, which is composed of only terms in which an order of a variable related to a radius is a second or lower order, and includes one or more terms in which an order of a variable related to a radius is a second order.

(Structure 7)

A mask blank provided with a thin film for forming a transfer pattern on one of a pair of opposing principal surfaces of a transparent substrate, wherein a surface of the thin film has a surface shape of which, in a case where a shape fitting on a virtual reference surface is carried out and difference data between the principal surface and the virtual reference surface is obtained in a calculation region within an inner side of a circle of 90 mm diameter based on a center of a substrate, a difference between a maximum height and a minimum height within the calculation region of the difference data is $\lambda/8$ or less provided that an exposure wavelength used for transfer is $\lambda$, and wherein the virtual reference surface has a shape defined by a Zernike polynomial expressed by a polar coordinate system, which is composed of only terms in which an order of a variable related to a radius is a second or lower order, and includes one or more terms in which an order of a variable related to a radius is a second order.

(Structure 8)

The mask blank according to Structure 6 or 7, wherein a determination coefficient $R^2$ calculated from difference data is 0.9 or more.

(Structure 9)

The mask blank according to any of Structures 6 to 8, wherein a surface of the thin film on a blank substrate has a flatness of 0.2 µm or less in an inner region of a square shape with a side of 132 mm based on a center of a substrate.

(Structure 10)

A transfer mask comprising a transfer pattern formed on the thin film of the mask blank according to any of Structures 5 to 9

(Structure 11)

The transfer mask according to Structure 10, wherein the transfer mask is placed on a mask stage of an exposure apparatus and is used for exposure and transfer upon a transfer object on a semiconductor substrate, the exposure apparatus having a function to correct a shape of a wavefront of a light, which transmitted from the transfer pattern of the transfer mask, in a shape defined by a Zernike polynomial.

(Structure 12)

A method of manufacturing a mask blank substrate for use in manufacturing a mask blank provided with a thin film for forming a transfer pattern on one of a pair of opposing principal surfaces of a transparent substrate, comprising the steps of fitting a shape of the principal surface of the transparent substrate to which the thin film is provided with a virtual reference surface and obtaining difference data between the principal surface and the virtual reference surface in a calculation region within an inner side of a circle of 104 mm diameter based on a center of a substrate, and selecting as the mask blank substrate the transparent substrate having a surface shape in which a difference between a maximum height and a minimum height within the calculation region of the difference data is $\lambda/8$ or less, provided that an exposure wavelength used for transfer is $\lambda$, and wherein the virtual reference surface has a shape defined by a Zernike polynomial expressed by a polar coordinate system, which is composed of only terms in which an order of a variable related to a radius is a second or lower order, and includes one or more terms in which an order of a variable related to a radius is a second order.

(Structure 13)

A method of manufacturing a mask blank substrate for use in manufacturing a mask blank provided with a thin film for forming a transfer pattern on one of a pair of opposing principal surfaces of a transparent substrate, comprising the steps of fitting a shape of the principal surface of the transparent substrate to which the thin film is provided with a virtual reference surface and obtaining difference data between the principal surface and the virtual reference surface in a calculation region within an inner side of a circle of 90 mm diameter based on a center of a substrate, and selecting as the mask blank substrate the transparent substrate having a surface shape in which a difference between a maximum height and a minimum height within the calculation region of the difference data is $\lambda/8$ or less, provided that an exposure wavelength used for transfer is $\lambda$, and wherein the virtual reference surface has a shape defined by a Zernike polynomial expressed by a polar coordinate system, which is composed of only terms in which an order of a variable related to a radius is a second or lower order, and includes one or more terms in which an order of a variable related to a radius is a second order.

(Structure 14)

The method of manufacturing a mask blank substrate according to Structure 12 or 13, further comprising the step of selecting the transparent substrate in which a determination coefficient $R^2$ calculated from the difference data is 0.9 or more.

(Structure 15)

The method of manufacturing a mask blank substrate according to any of Structures 12 to 14, further comprising the step of selecting the transparent substrate having a flatness of 0.2 μm or less in an inner region of a square shape with a side of 132 mm based on a center of the substrate to which the thin film is provided.

(Structure 16)

A method of manufacturing a mask blank comprising the step of providing a thin film for forming a transfer pattern on one of principal surfaces of a mask blank substrate manufactured by the method of manufacturing a mask blank substrate according to any of Structures 12 to 15.

(Structure 17)

A method of manufacturing a mask blank provided with a thin film for forming a transfer pattern on one of a pair of opposing principal surfaces of a transparent substrate, comprising the steps of fitting a shape of a surface of the thin film of the mask blank with a virtual reference surface and obtaining difference data between the principal surface and the virtual reference surface in a calculation region within an inner side of a circle of 104 mm diameter based on a center of a substrate, and selecting the mask blank having a surface shape in which a difference between a maximum height and a minimum height within the calculation region of the difference data is $\lambda/8$ or less, provided that an exposure wavelength used for transfer is $\lambda$, and wherein the virtual reference surface has a shape defined by a Zernike polynomial expressed by a polar coordinate system, which is composed of only terms in which an order of a variable related to a radius is a second or lower order, and includes one or more terms in which an order of a variable related to a radius is a second order.

(Structure 18)

A method of manufacturing a mask blank provided with a thin film for forming a transfer pattern on one of a pair of opposing principal surfaces of a transparent substrate, comprising the steps of fitting a shape of a surface of the thin film of the mask blank with a virtual reference surface and obtaining difference data between the principal surface and the virtual reference surface in a calculation region within an inner side of a circle of 90 mm diameter based on a center of a substrate, and selecting the mask blank having a surface shape in which a difference between a maximum height and a minimum height within the calculation region of the difference data is $\lambda/8$ or less, provided that an exposure wavelength used for transfer is $\lambda$, and wherein the virtual reference surface has a shape defined by a Zernike polynomial expressed by a polar coordinate system, which is composed of only terms in which an order of a variable related to a radius is a second or lower order, and includes one or more terms in which an order of a variable related to a radius is a second order.

(Structure 19)

The method of manufacturing a mask blank according to Structure 17 or 18, further comprising the step of selecting the mask blank in which a determination coefficient $R^2$ calculated from the difference data is 0.9 or more.

(Structure 20)

The method of manufacturing a mask blank according to any of Structures 17 to 19, further comprising the step of selecting the mask blank having a flatness of 0.2 μm or less in an inner region of a square shape with a side of 132 mm based on a center of the substrate on a surface of the thin film.

(Structure 21)

A method of manufacturing a transfer mask comprising the step of forming a transfer pattern on the thin film of a mask blank manufactured by the method of manufacturing a mask blank according to any of Structures 16 to 20.

(Structure 22)

The method of manufacturing a transfer mask according to Structure 21 of this invention, wherein the transfer mask is placed on a mask stage of an exposure apparatus and is used for exposure and transfer upon a transfer object on a semiconductor substrate, the exposure apparatus having a function to correct a shape of a wavefront of a light, which transmitted from the transfer pattern of the transfer mask, in a shape defined by a Zernike polynomial.

(Structure 23)

A method of manufacturing a semiconductor device comprising placing the transfer mask of Structure 10 or 11 on a mask stage of an exposure apparatus and transferring a transfer pattern of the transfer mask on a semiconductor substrate by a lithography method.

(Structure 24)

The method of manufacturing a semiconductor device according to Structure 23, wherein the exposure apparatus has a function to correct a shape of a wavefront of a light, which transmitted from the transfer pattern of the transfer mask, in a shape defined by a Zernike polynomial.

(Structure 25)

A method of manufacturing a semiconductor device comprising placing the transfer mask manufactured by the method of manufacturing a transfer mask of Structure 21 or 22 on a mask stage of an exposure apparatus and transferring a transfer pattern of the transfer mask on a semiconductor substrate by a lithography method.

Effect of the Invention

According to this invention, by selecting using a reference value where the mechanical flatness is replaced by the optical flatness, a mask blank substrate can be obtained which satisfies the requirement of an extremely high substantial flatness of one-eighth of an exposure wavelength $\lambda$. This makes it possible to manufacture such an ultra-flat mask blank substrate without reducing the manufacturing throughput of the mask blank substrate, and also reducing facility cost of manufacturing devices. Effective flatness of the mask blank and the transfer mask can be made higher, similar to the mask blank substrate. When exposed using the transfer mask, focus latitude and high positional precision are assured, and extremely high transfer accuracy can be obtained. As a result, the circuit operation characteristic of the semiconductor device to be manufactured is stabilized.

MODES FOR CARRYING OUT THE INVENTION

Figure 1:
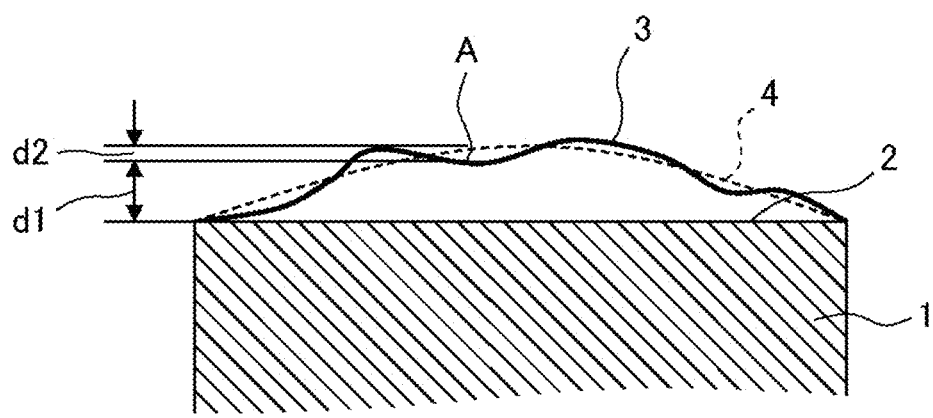
FIG. 1 is a cross-sectional view of a mask blank substrate for explaining the concept of this invention.

The best modes for carrying out this invention are concretely explained below, including their concepts and with reference to the drawings. Same reference numerals are applied to identical or corresponding portions in the drawings of which descriptions therefor may be simplified or omitted.

[Mask Blank Substrate and its Manufacturing Method]

A mask blank substrate and its manufacturing method are explained. First, the structural concept of this invention is explained followed by examples carried out based on the concept, including comparative examples and reference examples.

This invention is based on the matter that what is essentially demanded in image transfer through a projection lens is not always a mechanical plane, but an optically flat surface with an even wavefront, which is explained using FIG. 1. As mentioned above in the background art, there is a demand for an extremely high flatness for a principal surface of a mask blank substrate (one of the principal surfaces to which a thin film for forming a transfer pattern is provided). FIG. 1 shows a cross-section of a mask blank in which, generally, a principal surface of a mask blank 1 is ideally a completely flat face as represented by reference numeral 2 in FIG. 1. However, it is extremely difficult to actually manufacture such a completely flat face. While efforts have been made for more flatness by using methods such as local plasma etching, such a method causes various adverse effects such as low throughput, higher device cost, and generation of foreign matter defects. Therefore, instead of seeking a mechanically flat surface, a change of idea was made to seek an optically flat surface, or in other words, to seek an even wave front flat surface.

In this invention, an optically flat surface is approximated to a polished surface deviated from a mechanically flat surface using aberration correction function for correcting lens aberration provided on a projection lens of an exposure apparatus. This point is explained along with FIG. 1. Reference numeral 3 in FIG. 1 represents a cross-sectional shape of a principal surface formed by polishing. For example, while a deviation from an ideal mechanical flat surface at point A in FIG. 1 is represented by d1, deviation from an optically flat surface (cross section) 4 using the aberration correction function of the exposure apparatus can be made as extremely small as d2. The optically flat surface herein indicates a surface showing an ideal imaging by a ray of light with an even wavefront emitted from this surface intentionally providing aberration to the projection lens using the lens aberration correcting function. In other words, the optically flat surface used herein indicates an object point surface on a conjugate of the projection lens when a wafer surface is deemed as an image point surface, the object point surface deformed from a mechanically flat surface to a shape closer to the desired shape by intentionally giving aberration to the projection lens. In this application, the flatness of the object point surface is referred to as an optical flatness. The optical flatness is not a single fixed surface as a mechanically complete flat face, but is a surface that is determined with a certain degree of freedom in accordance with the surface shape of a mask blank substrate, facilitating higher flatness.

Further, this invention uses a Zernike polynomial approximate surface, which is a polar coordinate system, in describing the optically flat surface. The origin of the polar coordinate is the center of the mask blank substrate. Although a mask blank used in ArF exposure apparatus, etc. is partially chamfered at a corner portion, since the mask blank is a square with a width of about 152 mm both vertically and horizontally, and a layout of a mask pattern figure is represented by XY coordinates, XY coordinate system is generally used as a coordinate system display. The characteristic point of this invention resides in using a polar coordinate system to describe a square shape. Zernike polynomial approximation is a rectangular coordinate system, with each variable being independent so that handling is easy, and since aberration characteristic of a projection lens can be corresponded to each term in Zernike polynomial expansion of a wavefront of the projection lens on the pupil surface which is a Fourier transform surface, it is highly preferable in associating projection lens aberration correction with an optically flat surface of a blank substrate face. While an ArF scanner is the current mainstream ArF exposure apparatus, it is not limited to a scanner but can also be a stepper. The light source is not limited to an ArF excimer laser (wavelength 193 nm) but can be, for example, a KrF excimer laser (wavelength 248 nm).

The essential part of this invention is fitting a shape of a polished mask blank principal surface with a surface shape of an optically flat surface as a virtual reference surface represented by Zernike polynomial approximation, and selecting those with a difference falling within a reference value or less. In addition, detailed study was made on the following points to manufacture a mask blank substrate providing better transfer properties.

Aberration correction function of a projection lens can be of a term with higher order where the order of a variable related to a radius in the Zernike polynomial is third or higher order. It was found that when fitting is conducted using a term with higher order, though fine until a certain point, a disadvantage occurs due to a change in high order aberration of the projection lens depending on exposure condition. This point is described in detail below in [Exposure Method and Manufacturing Method of a Device Using the Same]. Furthermore, it was also found that the order including only the term of first order would be a one-dimensional tilt correction, from which a sufficient optical flatness cannot be obtained. Thus, it was found out as a result of detailed study that it is essential that the order of a variable related to a radius is composed only of the term of second or lower order, and that the order of a variable related to a radius has one or more terms of second order. The typical term of second order necessary is a defocus term, which corresponds to the fourth term in The University of Arizona style and the fifth term in the standard style. This is the third characteristic point of this invention. While Zernike polynomial approximation includes various methods such as standard, The University of Arizona, and fringe Zernike, any style of Zernike polynomial approximation can be used for application to this invention in the term where the order of a variable related to a radius is the second or lower order, though there are differences in the order and coefficients.

As an index to judge and select the fitting degree, the difference between the maximum height and minimum height of the difference shape between the virtual reference surface and the shape of the mask blank principal surface within 104 mm diameter which is the maximum value of exposure slit length during scanning exposure of an exposure apparatus, namely, PV value was found to be preferable as a result of a study. Since even one point deviation of PV value causes similar degree of deviation in the wavefront, an adverse effect occurs on that site in transfer properties. As a reference value for selection, one-eighth of exposure wavelength λ, namely, λ/8 is preferable, which sufficiently minimizes adverse effects upon projection exposure by phase difference and which is one of the references of measuring accuracy of wavefront measurement devices. As a result of transfer evaluation, sufficient transfer accuracy was normally obtained with this reference. In cases where higher accuracy is demanded, such as adjustment of an exposure apparatus and conducting QC (Quality Control), the reference value for selection is preferably λ/10.

Second fitting selection index is a determination coefficient $R^2$ calculated from the difference shape mentioned above. The determination coefficient $R^2$ is the square of multiple correlation coefficients also referred to as a contribution rate, which is an index often used as a degree of application of a regression equation calculated from a sample value. Its definition equation is as follows, with y as an actual measurement value and f as an estimate value by the regression equation.

[Equation 1]

$$R^2 \equiv 1 - \frac{\sum_i (y_i - f_i)^2}{\sum_i (y_i - \bar{y})^2} \quad \text{(Equation 1)}$$

The closer the value is to 1 indicates the relative residual less. While PV value is an index for selecting abnormalities at a point, a determination coefficient $R^2$ is an index showing the residual size of the overall shape. As a result of various studies by forming a mask and taking correlation with transfer, 0.9 or more determination coefficient $R^2$ could obtain sufficient transfer accuracy.

In the above method, an optical flatness within 104 mm diameter based on the center of a mask blank can be sufficiently secured, while chip exposure is carried out in 104 mm×132 mm region at maximum. In addition to the selection of the optical flatness mentioned above, further preferable transfer results were obtained throughout the surface by using in combination a reference where the flatness in an inner region of a square shape with a side of 132 mm based on the center of the mask blank substrate is 0.2 μm or less. While the chip exposure at the maximum of 104 mm×132 mm is smaller than the measurement reference region of 132 mm×132 mm, this is for the purpose of not limiting the orientation of the mask blank. Further, the principal surface of the mask blank substrate should be mirror-polished to a predetermined surface roughness or more. It is preferable that the principal surface has 0.2 nm or less root mean square roughness Rq calculated within an inner region of a square shape of 5 μm side, more preferably, 0.15 nm or less. Surface roughness can be measured using, e.g., an atomic force microscope (AFM).

Generally, in a transfer mask, a pattern forming region to which a transfer pattern can be formed is a region inside of 104 mm×132 mm. A transfer pattern generally includes a mixture of a relatively sparse region and a relatively dense region, or a region including a relatively fine pattern and a region including a relatively large pattern. The outer side of the pattern forming region is often configured without a region with a dense pattern and a region with a fine pattern. Due to the problem of focus latitude, a high optical flatness is demanded for a mask blank substrate in transferring a fine pattern. Further, in a mask blank substrate, applying an inner region of a circle of 104 mm diameter based on the center of the substrate as a region to secure optical flatness causes the problem that production yield of the substrate is unlikely to increase. Considering these points, as another embodiment of the mask blank substrate of this invention, a structure can be made in which the region to secure optical flatness is the inner region of a circle of 90 mm diameter based on the center of the substrate.

Namely, in another embodiment, the region to which the principal surface of the substrate to which a thin film is provided is fitted with respect to the virtual reference surface which is the shape defined by the Zernike polynomial (calculation region) is the inner region of a circle of 90 mm diameter based on the center of the substrate. By the fitting, the difference data between the principal surface of the substrate and the virtual reference surface is obtained, and from the difference data, PV value, which is the difference between the maximum height and the minimum height within the calculation region, is calculated. Also in the mask blank substrate of this embodiment, PV value calculated in the calculation region is preferably one-eighth of an exposure wavelength λ, namely, λ/8. Further, in cases where high accuracy is demanded, it is more preferable that the selection reference value is λ/10. In another embodiment of this invention, the matter regarding so-called mechanical flatness, the matter regarding surface roughness, and the matter regarding second fitting selection index, etc. are similar to the embodiment of this invention.

Figure 2:
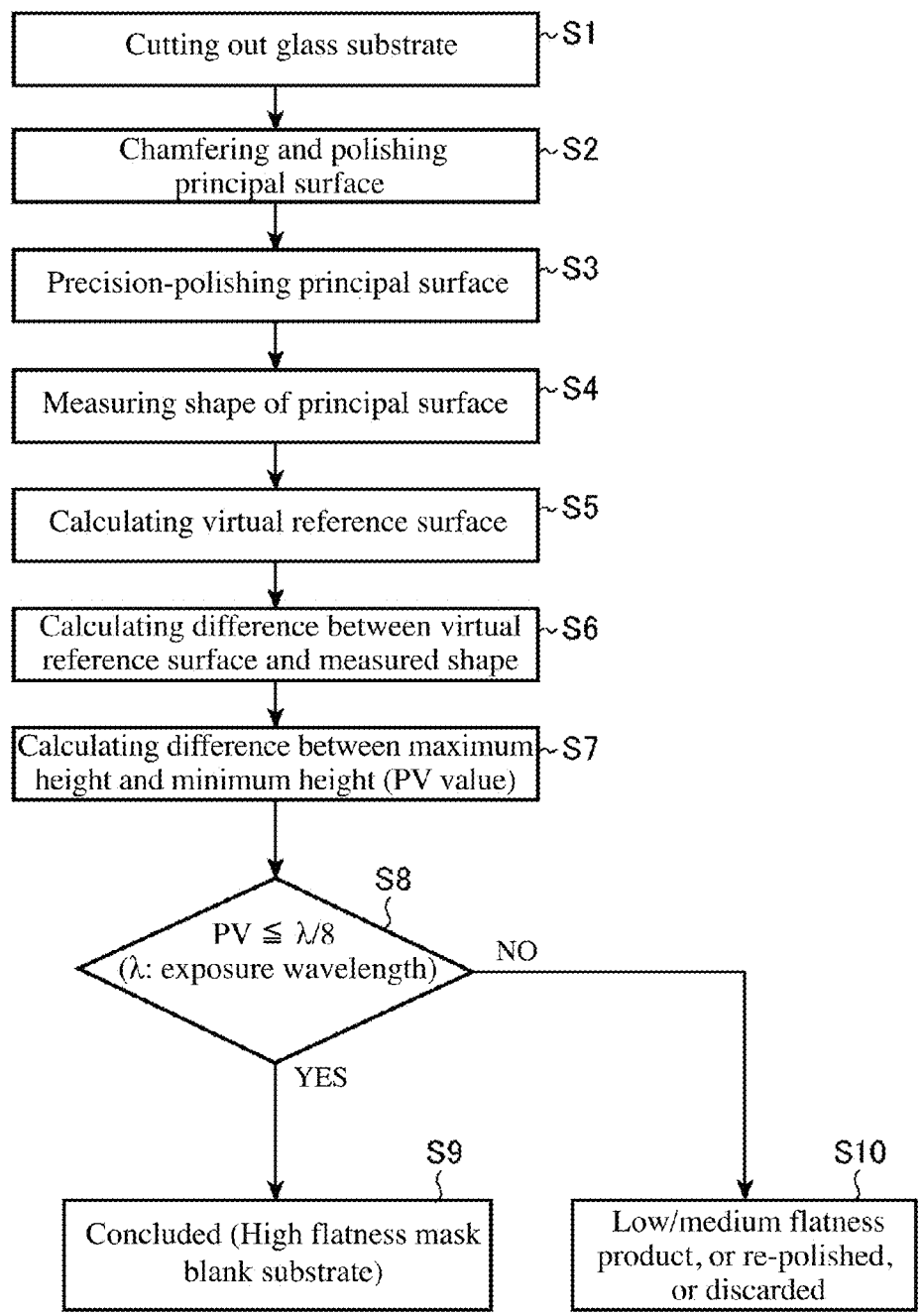
FIG. 2 is a process flow chart showing the manufacturing process of the mask blank substrate of this invention.

Next, steps of manufacturing a high flatness mask blank substrate are explained in line with the concept of this invention with reference to the manufacturing process flow chart of the mask blank substrate in FIG. 2.

First, as shown in Step S1 of FIG. 2, a synthetic quartz ingot is cut out in the shape of a mask blank substrate, followed by a grinding step for polishing a principal surface, an end face, and a chamfered face of the cut-out substrate as shown in Step S2 of the same, followed by a step for precisely polishing the principal surface as shown in Step S3 of the same. The polishing is normally carried out in multiple stages. There are various polishing methods preferably including CMP (Chemical Mechanical Polishing) using polishing agents such as cerium oxide and polishing using polishing agents such as colloidal silica, but without particular limitation. Subsequently, the shape of the principal surface is measured precisely as shown in Step S4 of the same. The steps up to Step S4 given above can be conducted with normal methods. While synthetic quartz glass common as a mask blank material was used above, the material is not necessarily limited thereto, as long as the material can be used as a transfer mask substrate. For example, soda-lime glass, aluminosilicate glass, borosilicate glass, alkali-free glass, calcium fluoride, and so forth can be applied, depending on exposure wavelength.

The characteristic of this invention resides in Step S5 and thereafter of FIG. 2. First, a virtual reference surface is calculated in Step S5. As mentioned above, the virtual reference surface is a shape defined by a Zernike polynomial expressed by a polar coordinate system, of which an order of a variable related to a radius composed only of the term of second or lower order, and in which the order of a variable related to a radius includes one or more terms of second order. Its range is within a 104 mm diameter circle (within 90 mm diameter circle in the case of another embodiment of this invention) centered on the center of the mask blank substrate. The virtual reference surface is calculated with reference to the surface shape of the principal surface of the mask blank substrate measured in Step S4. Next, as shown in Step S6 of FIG. 2, the difference shape between the shape of the virtual reference surface calculated in Step S5 and the shape of the principal surface of the mask blank substrate actually measured in Step S4 is calculated to obtain difference shape data (difference data). Thereafter, as shown in Step S7 of FIG. 2, the difference between the maximum height and minimum height, the so-called PV value, is calculated from the difference data obtained in Step S6. Thereafter, as shown in Step S8 in FIG. 2, judgment is made whether the PV value determined in Step S7 is one-eighth of an exposure wavelength $\lambda$, namely, $\lambda/8$ or less, or beyond that value, and if the value is $\lambda/8$ or less, selection is made as a high flatness mask blank substrate and the step is concluded (FIG. 2: Step S9). If beyond that value, consideration is made for use as a mask blank substrate for middle layer or rough layer as a low/medium flatness product; returned to the polishing step in Step S3; placed under local processing step and through the same steps again after Step S4; or the mask blank substrate is discarded (FIG. 2: Step S10). Through the manufacturing method of the mask blank substrate mentioned above, a mask blank substrate with an extremely high flatness having an optical flatness of $\lambda/8$ or less can be manufactured with high throughput. In the case of ArF excimer exposure, $\lambda/8$ is 25 nm (rounded up to a whole number), and an optical flatness that is significantly higher than conventional methods can be obtained without reducing throughput upon processing of the mask blank substrate, also reducing facility cost of manufacturing devices.

Figure 3:
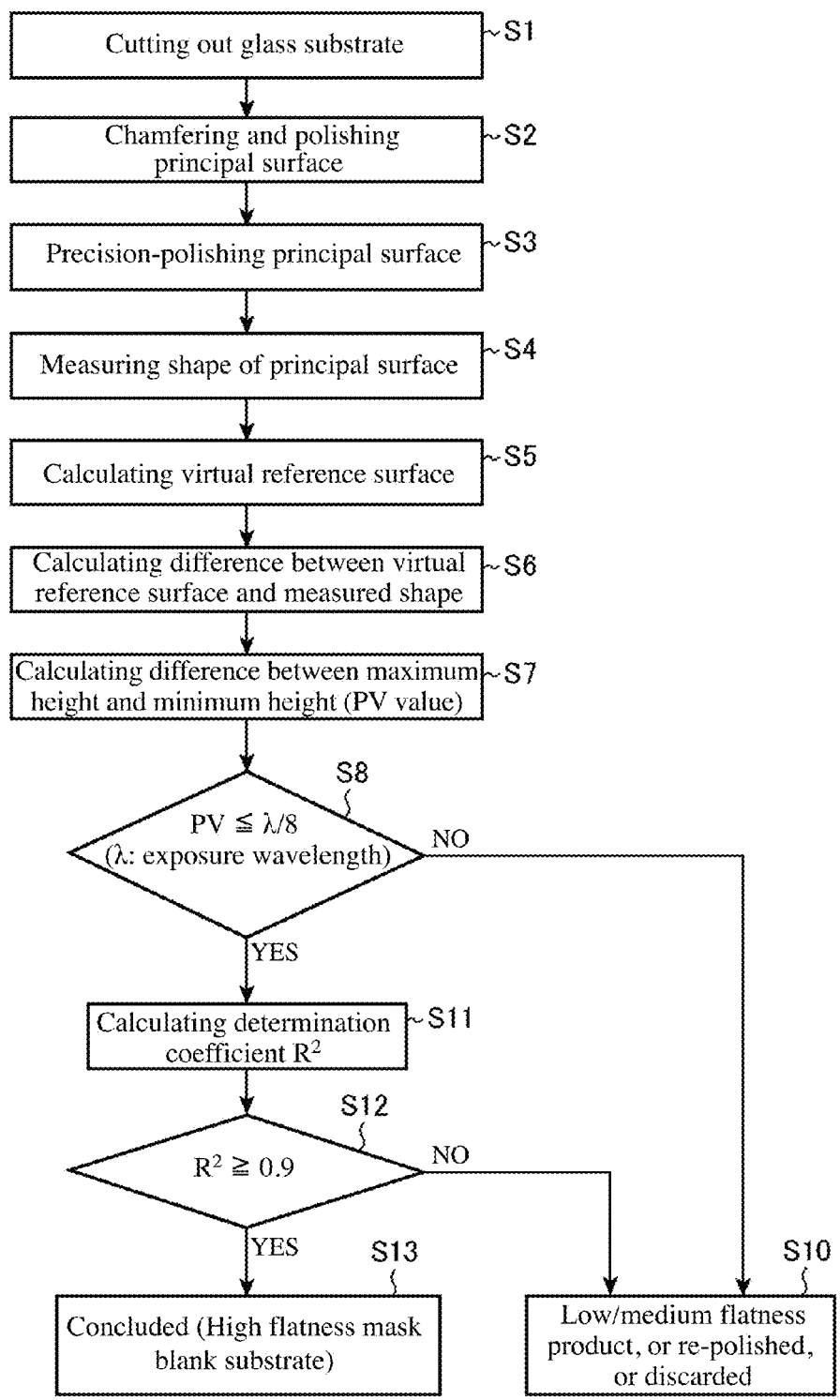
FIG. 3 is a process flow chart showing the manufacturing process of the mask blank substrate of this invention.
Figure 4A:
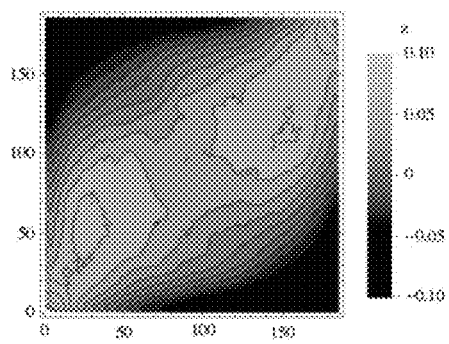
FIG. 4A is a principal surface shape distribution of the mask blank substrate of Sample A of Examples obtained by Example 1, showing a surface height contour distribution viewed from the top surface of the mask blank.
Figure 4B:
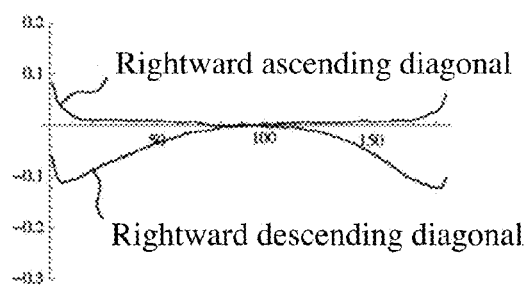
FIG. 4B is a principal surface shape distribution of the mask blank substrate of Sample A of Examples obtained by Example 1, showing a height distribution property curve in a diagonal direction.
Figure 4C:
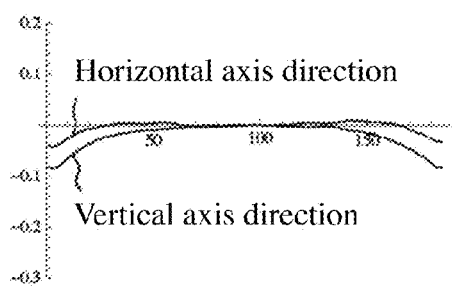
FIG. 4C is a principal surface shape distribution of the mask blank substrate of Sample A of Examples obtained by Example 1, showing a height distribution property curve of a central portion of the mask blank cut vertically and horizontally.
Figure 5A:
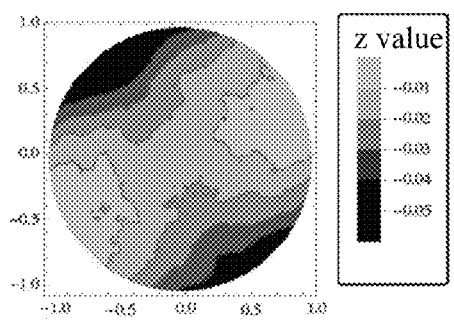
FIG. 5A is a contour distribution showing a surface shape distribution of Sample A of Examples, which is a contour distribution showing a measured shape within 104 mm diameter.
Figure 5B:
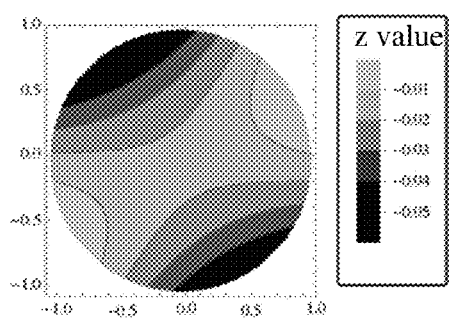
FIG. 5B is a contour distribution showing a surface shape distribution of Sample A of Examples, which is a contour distribution showing a virtual reference surface corresponding to the measured shape within 104 mm diameter.
Figure 5C:
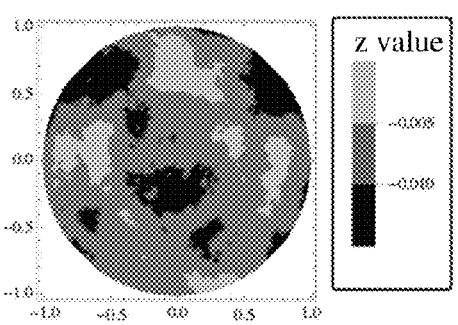
FIG. 5C is a contour distribution showing a surface shape distribution of Sample A of Examples, which is a difference shape contour distribution showing the difference between actual measurement and the virtual reference surface.
Figure 6A:
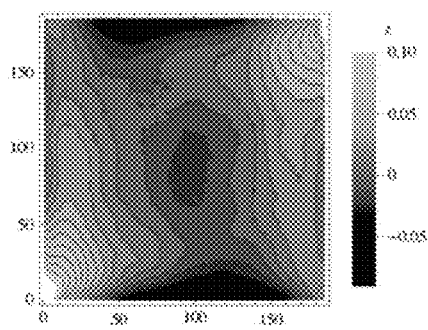
FIG. 6A is a principal surface shape distribution of the mask blank substrate of Sample B of Examples, showing a surface height contour distribution viewed from the top surface of the mask blank.
Figure 6B:
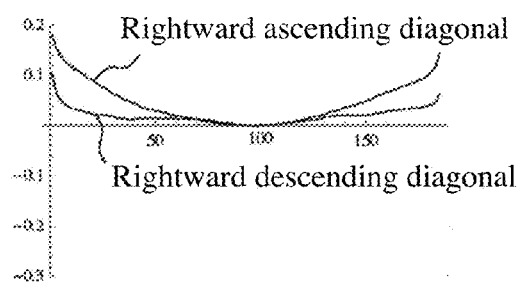
FIG. 6B is a principal surface shape distribution of the mask blank substrate of Sample B of Examples, showing a height distribution property curve in a diagonal direction.
Figure 6C:
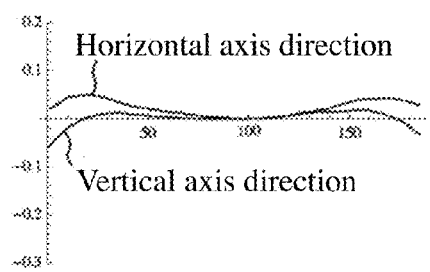
FIG. 6C is a principal surface shape distribution of the mask blank substrate of Sample B of Examples, showing a height distribution property curve of a central portion of the mask blank cut vertically and horizontally.
Figure 7A:
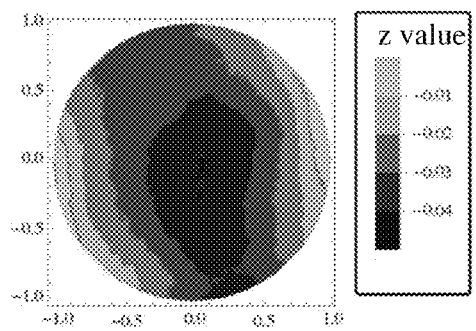
FIG. 7A is a contour distribution showing a surface shape distribution of Sample B of Examples, which is a contour distribution showing a measured shape within 104 mm diameter.
Figure 7B:
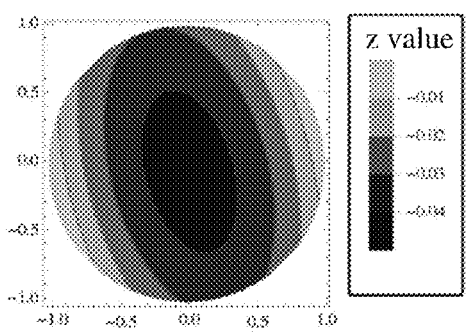
FIG. 7B is a contour distribution showing a surface shape distribution of Sample B of Examples, which is a contour distribution showing a virtual reference surface corresponding to the measured shape within 104 mm diameter.
Figure 7C:
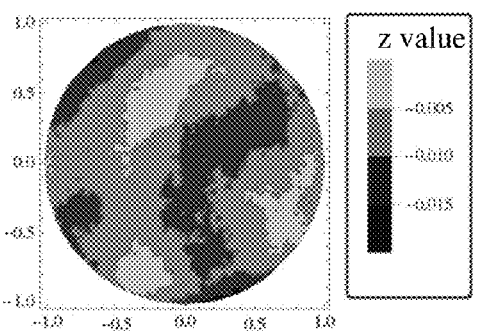
FIG. 7C is a contour distribution showing a surface shape distribution of Sample B of Examples, which is a difference shape contour distribution showing the difference between actual measurement and the virtual reference surface.
Figure 8A:
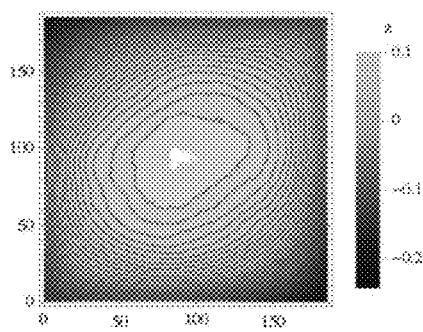
FIG. 8A is a principal surface shape distribution of the mask blank substrate of Sample C of Reference Examples, showing a surface height contour distribution viewed from the top surface of the mask blank.
Figure 8B:
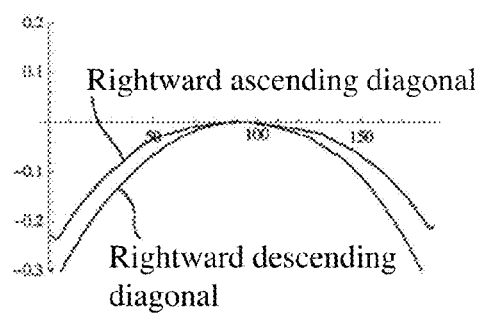
FIG. 8B is a principal surface shape distribution of the mask blank substrate of Sample C of Reference Examples, showing a height distribution property curve in a diagonal direction.
Figure 8C:
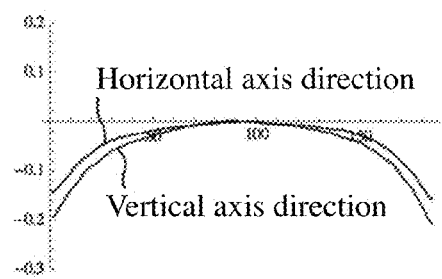
FIG. 8C is a principal surface shape distribution of the mask blank substrate of Sample C of Reference Examples, showing a height distribution property curve of a central portion of the mask blank cut vertically and horizontally.
Figure 9A:
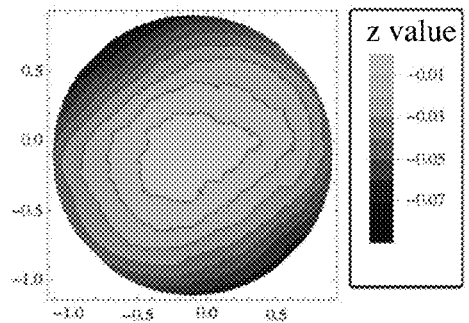
FIG. 9A is a contour distribution showing a surface shape distribution of Sample C of Reference Examples, which is a contour distribution of a measured shape within 104 mm diameter.
Figure 9B:
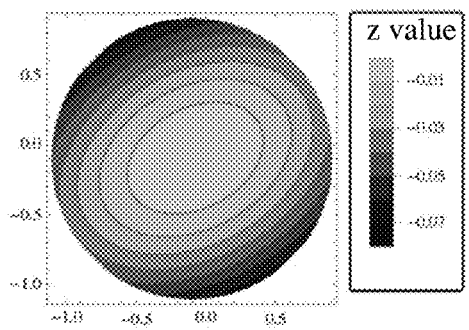
FIG. 9B is a contour distribution showing a surface shape distribution of Sample C of Reference Examples, which is a contour distribution of a virtual reference surface corresponding to the measured shape within 104 mm diameter.
Figure 9C:
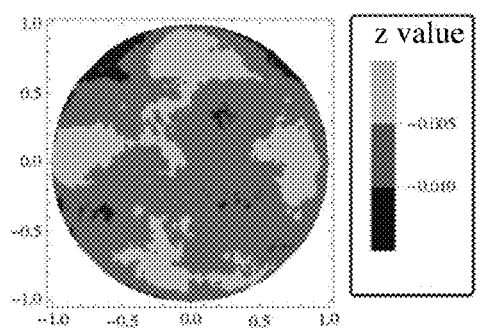
FIG. 9C is a contour distribution showing a surface shape distribution of Sample C of Reference Examples, which is a difference shape contour distribution showing the difference between actual measurement and the virtual reference surface.
Figure 10A:
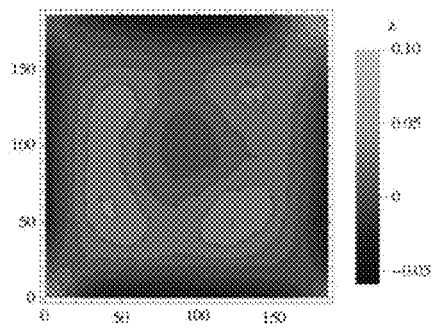
FIG. 10A is a principal surface shape distribution of the mask blank substrate of Sample X1 of Comparative Examples, showing a surface height contour distribution viewed from the top surface of the mask blank.
Figure 10B:
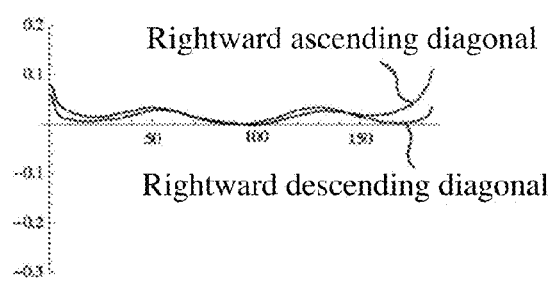
FIG. 10B is a principal surface shape distribution of the mask blank substrate of Sample X1 of Comparative Examples, showing a height distribution property curve in a diagonal direction.
Figure 10C:
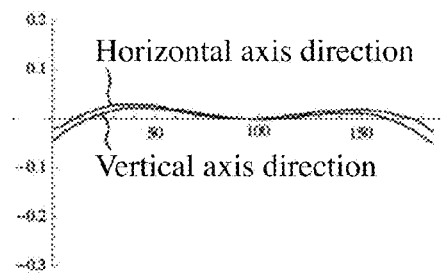
FIG. 10C is a principal surface shape distribution of the mask blank substrate of Sample X1 of Comparative Examples, showing a height distribution property curve of a central portion of the mask blank cut vertically and horizontally.
Figure 11A:
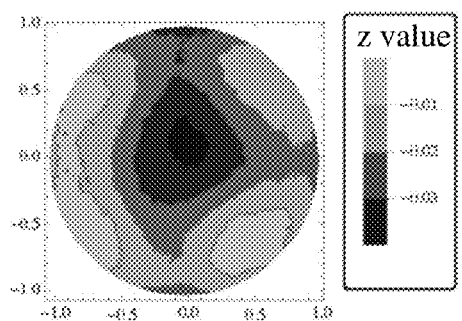
FIG. 11A is a contour distribution showing a surface shape distribution of Sample X1 of Comparative Examples, which is a contour distribution showing a measured shape within 104 mm diameter.
Figure 11B:
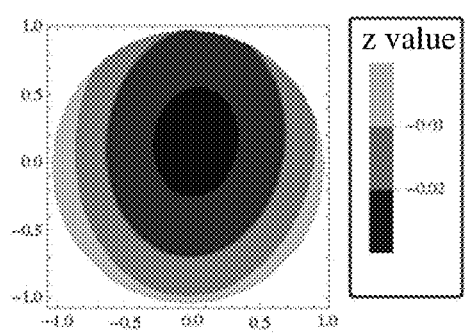
FIG. 11B is a contour distribution showing a surface shape distribution of Sample X1 of Comparative Examples, which is a contour distribution showing a virtual reference surface corresponding to the measured shape within 104 mm diameter.
Figure 11C:
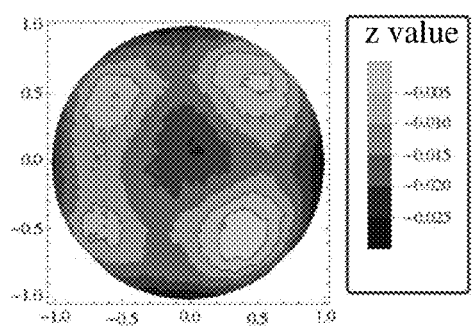
FIG. 11C is a contour distribution showing a surface shape distribution of Sample X1 of Comparative Examples, which is a difference shape contour distribution showing the difference between actual measurement and the virtual reference surface.
Figure 12A:
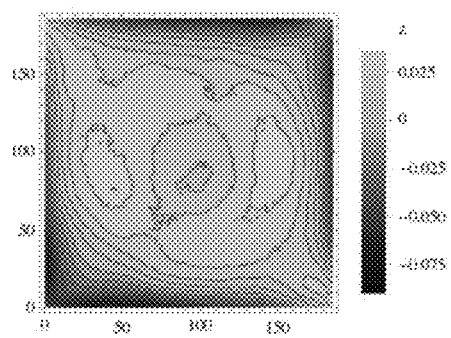
FIG. 12A is a principal surface shape distribution of the mask blank substrate of Sample X2 of Reference Examples, showing a surface height contour distribution viewed from the top surface of the mask blank.
Figure 12B:
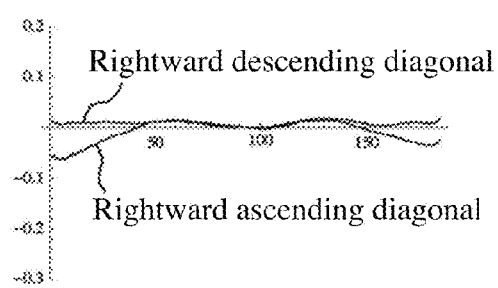
FIG. 12B is a principal surface shape distribution of the mask blank substrate of Sample X2 of Reference Examples, showing a height distribution property curve in a diagonal direction.
Figure 12C:
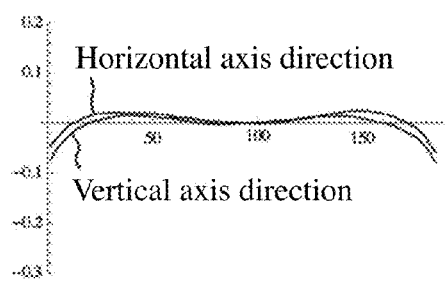
FIG. 12C is a principal surface shape distribution of the mask blank substrate of Sample X2 of Reference Examples, showing a height distribution property curve of a central portion of the mask blank cut vertically and horizontally.
Figure 13A:
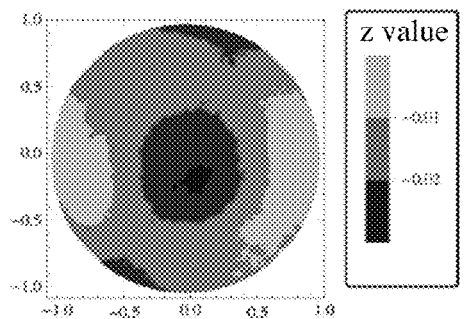
FIG. 13A is a contour distribution showing a surface shape distribution of Sample X2 of Reference Examples, which is a contour distribution showing a measured shape within 104 mm diameter.
Figure 13B:
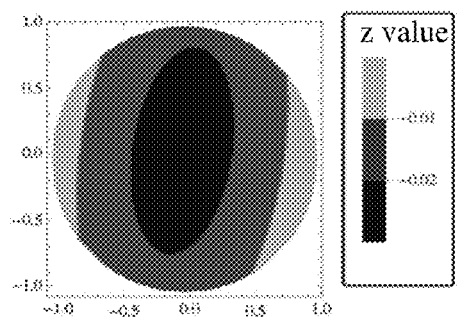
FIG. 13B is a contour distribution showing a surface shape distribution of Sample X2 of Reference Examples, which is a contour distribution showing a virtual reference surface corresponding to the measured shape within 104 mm diameter.
Figure 13C:
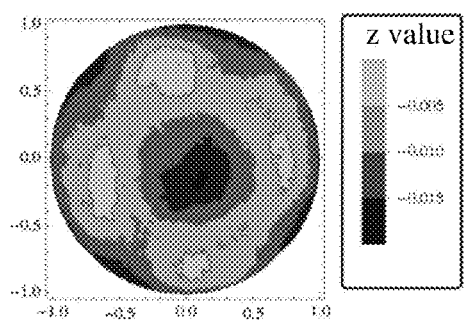
FIG. 13C is a contour distribution showing a surface shape distribution of Sample X2 of Reference Examples, which is a difference shape contour distribution showing the difference between actual measurement and the virtual reference surface.
Figure 14A:
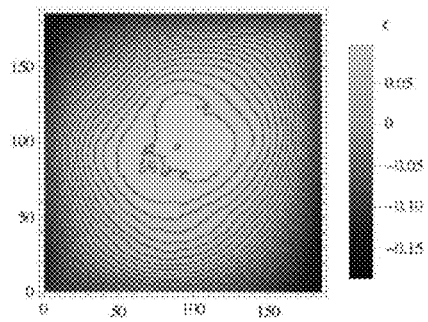
FIG. 14A is a principal surface shape distribution of the mask blank substrate of Sample X3 of Comparative Examples, which is a surface height contour distribution viewed from the top surface of the mask blank.
Figure 14B:
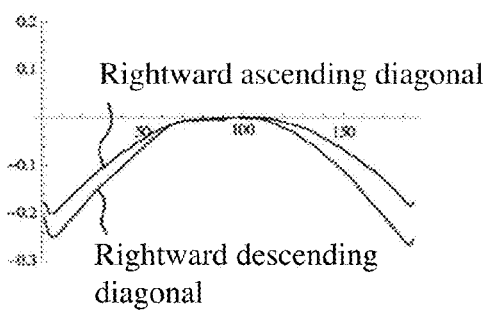
FIG. 14B is a principal surface shape distribution of the mask blank substrate of Sample X3 of Comparative Examples, which is a height distribution property curve in a diagonal direction.
Figure 14C:
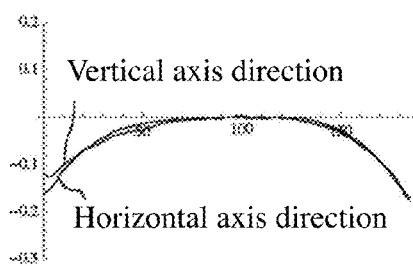
FIG. 14C is a principal surface shape distribution of the mask blank substrate of Sample X3 of Comparative Examples, which is a height distribution property curve of a central portion of the mask blank cut vertically and horizontally.
Figure 15A:
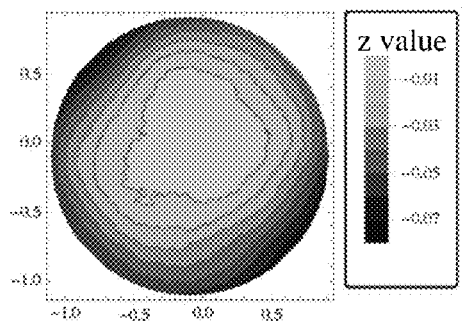
FIG. 15A is a contour distribution showing a surface shape distribution of Sample X3 of Comparative Examples, which is a contour distribution showing a measured shape within 104 mm diameter.
Figure 15B:
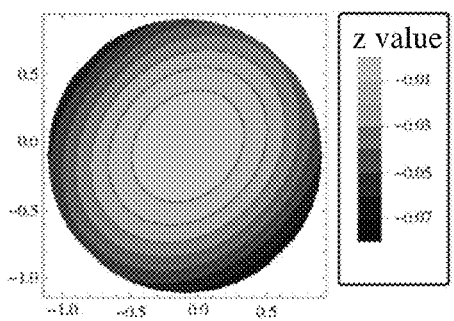
FIG. 15B is a contour distribution showing a surface shape distribution of Sample X3 of Comparative Examples, which is a contour distribution showing a virtual reference surface corresponding to the measured shape within 104 mm diameter.
Figure 15C:
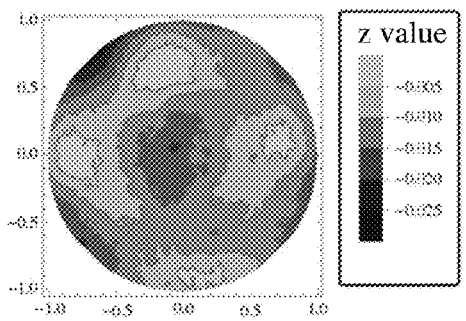
FIG. 15C is a contour distribution showing a surface shape distribution of Sample X3 of Comparative Examples, which is a difference shape contour distribution showing the difference between actual measurement and the virtual reference surface.
Figure 16A:
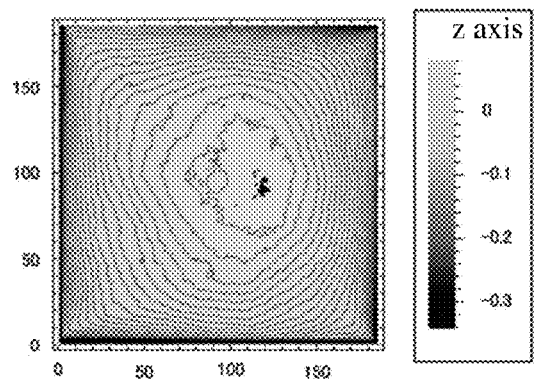
FIG. 16A is a principal surface shape distribution of the mask blank substrate of Sample D of Examples, which is a surface height contour distribution viewed from the top surface of the mask blank.
Figure 16B:
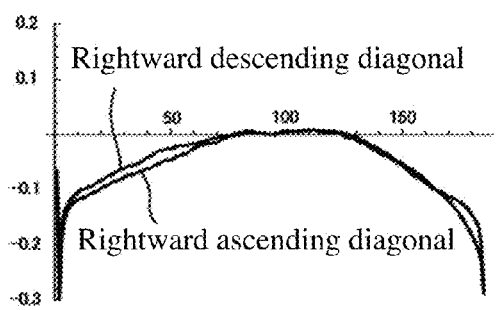
FIG. 16B is a principal surface shape distribution of the mask blank substrate of Sample D of Examples, which is a height distribution property curve in a diagonal direction.
Figure 16C:
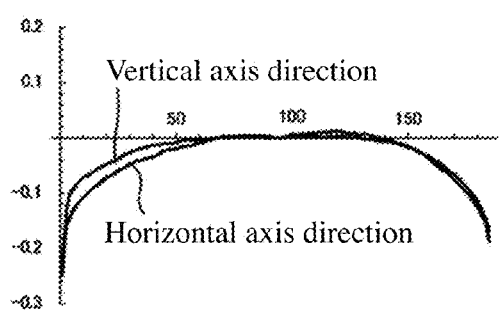
FIG. 16C is a principal surface shape distribution of the mask blank substrate of Sample D of Examples, which is a height distribution property curve of a central portion of the mask blank cut vertically and horizontally.

Next, another step of manufacturing a mask blank substrate using a determination coefficient $R^2$ is explained below with reference to the manufacturing process flow chart of the mask blank substrate in FIG. 3. The steps up to Step S8 are identical to the manufacturing method of the mask blank substrate in FIG. 2 mentioned above. The difference is that in Step S8 and thereafter, in the case where PV value is $\lambda/8$ or less, the determination coefficient $R^2$ is calculated that is calculated from a difference shape (difference data) as shown in Step S11 of FIG. 3. As shown in Step S12 of FIG. 3, in the case where the determination coefficient $R^2$ is 0.9 or more, selection is made as a high flatness mask blank substrate and the step is concluded. If less than 0.9, consideration is made for use as a mask blank substrate for middle layer or rough layer as a low/medium flatness product; returned to the polishing step in Step S3; placed under local processing step and through the same steps again after Step S4; or the mask blank substrate is discarded. In this method, since not only an abnormality at a single point is judged but selection is made in combination with the fitting degree with the optically flat surface of the entire shape, transfer accuracy of the mask manufactured using the mask blank substrate is high.

Steps S11 and S12 can be carried out at any stages as long as Step S6 for calculating the difference shape has been carried out. For example, Step S11 can be carried out between Step S7 and Step S8, or Steps S11 and S12 can be carried out before Step S8. Further, the order of calculation of PV value and comparison/judgment with reference value (Steps S7 and S8) and calculation of the determination coefficient $R^2$ and comparison/judgment with reference value (Steps S11 and S12) can be replaced. It is preferable that the information of the virtual reference surface determined herein is stored and is reflected to the lens aberration correcting function of the exposure apparatus, which facilitates exposure at a conjugate plane of the projection lens.

In the step of manufacturing a mask blank substrate of this invention, it is preferable to include the step of selecting a substrate in which a mechanical flatness of the principal surface of the transparent substrate is 0.2 µm or less at an inner region of a square with a side of 132 mm based on the center of the substrate (step of selecting a substrate based on mechanical flatness index). The step of selecting a substrate having flatness of 0.2 µm or less is more preferably carried out after the principal surface shape measuring step in Step S4 for efficiently proceeding a selection according to use.

[Mask Blank and its Manufacturing Method]

The mask blank of this invention is characterized by providing a thin film for forming a transfer pattern on one of the principal surfaces of the mask blank substrate mentioned above. Further, the manufacturing method of the mask blank of this invention is characterized by including the step of providing a thin film for forming a transfer pattern on one of the principal surfaces of the mask blank substrate manufactured by the manufacturing method of the mask blank substrate mentioned above.

What's important at this stage is control of stress. Flatness of a substrate surface changes when a mask blank substrate deforms due to the stress by the thin film. This deformation of a principal surface of a substrate due to film stress is a relatively simple deformation of a concentric quadratic surface, which can be handled by aberration correction of an exposure apparatus. On the other hand, there is a problem that when the stress of the thin film is excessive, a position displacement of the thin film pattern occurs during patterning of the thin film conducted during manufacture of the transfer mask from the mask blank. Relationship between the film stress and the amount of change in mechanical flatness within an inner region of a square with 132 mm side based on the center of the mask blank was examined. The result was that for the amounts of change in flatness of 10 nm, 20 nm, 25 nm, 30 nm, 40 nm, and 50 nm, corresponding film stresses were 55 MPa, 110 MPa, 137 MPa, 165 MPa, 220 MPa, and 275 MPa, respectively. From this result, it can be understood that the stress of the thin film is preferably 275 MPa or less, more preferably 165 MPa or less, and even more preferably 110 MPa or less.

Therefore, it is necessary to adjust the film stress of the thin film, by the methods including, for example, a method of heating treatment (annealing) and a method of light irradiation treatment for irradiating high energy light such as a flash lamp to the thin film. By forming the thin film considering the film stress adjustment, an optically ultra-flat mask blank of one-eighth of an exposure wavelength λ can be manufactured. When exposure is made using the transfer mask manufactured using the mask blank, excellent focal depth, inhibition of positional displacement, and resolution can be achieved, also stabilizing circuit characteristics of a semiconductor device manufactured using the same.

As stated above, the deformation of a principal surface of a mask blank substrate generated by the stress of a thin film for forming the pattern is a relatively simple deformation of a concentric quadratic surface. This deformation can be shown by a term where the order of a variable related to a radius in the Zernike polynomial is the second or lower order. Therefore, in a thin film for forming a transfer pattern of a mask blank, the surface of the thin film having a surface shape of which, in the case where a shape fitting on a virtual reference surface is carried out in a calculation region within an inner side of a circle of 104 mm diameter (circle of 90 mm diameter in another embodiment of this invention) based on the center of the substrate and difference data between the principal surface and the virtual reference surface is obtained, the difference between the maximum height and the minimum height within the calculation region of the difference data is λ/8 or less with transferring exposure wavelength λ, further that shape of the virtual reference surface is defined by a Zernike polynomial expressed by a polar coordinate system, which is composed of only terms in which the order of a variable related to a radius is the second or lower order, and includes one or more terms in which the order of the variable related to the radius is the second order, can be regarded as the mask blank of this invention. With the mask blank of this invention, an effect can be obtained that is similar to the mask blank mentioned above provided with a thin film for forming a transfer pattern on one principal surface of the mask blank substrate of this invention.

For the same reason, the manufacturing method of a mask blank of this invention can include the steps of fitting a shape of the surface of a thin film for forming a transfer pattern of a mask blank with a virtual reference surface and obtaining difference data between the principal surface and the virtual reference surface in a calculation region within an inner side of a circle of 104 mm diameter (circle of 90 mm diameter in another embodiment of this invention) based on a center of a substrate, and selecting the mask blank having a surface shape in which the difference between the maximum height and the minimum height within the calculation region of the difference data is λ/8 or less, provided that an exposure wavelength used for transfer is λ, and in which the virtual reference surface has a shape defined by a Zernike polynomial expressed by a polar coordinate system, which is composed of only terms in which an order of a variable related to a radius is a second or lower order, and includes one or more terms in which an order of a variable related to a radius is a second order.

Further, for the same reason, the manufacturing method of the mask blank of this invention can further include the step of selecting a mask blank in which a determination coefficient $R^2$ calculated from difference data is 0.9 or more. Moreover, for the same reason, the manufacturing method of the mask blank of this invention can further include the step of selecting a mask blank in which flatness of the inner region of the square with a side of 132 mm based on the center of the substrate on the surface of the thin film is 0.2 µm or less.

The following structures (1) to (3) can be applied to the mask blank of this invention and the mask blank manufactured by the manufacturing method of the mask blank of this invention.

(1) A binary mask blank with a light shielding film formed from a material including transition metals The binary mask blank is configured to include a light shielding film (thin film for forming the pattern) on a transparent substrate, the light shielding film is formed from materials including transition metals such as chromium, tantalum, ruthenium, tungsten, titanium, hafnium, molybdenum, nickel, vanadium, zirconium, niobium, palladium, rhodium, etc. alone or in a compound. One example is a light shielding film formed from chromium, or a chromium compound including chromium and one or more elements selected from oxygen, nitrogen, carbon, etc. added thereto. A further example is a light shielding film formed from a tantalum compound including tantalum and one or more elements selected from oxygen, nitrogen, boron, etc. added thereto. Such a binary mask blank includes a light shielding film configured as a double layer structure of a light shielding layer and a front-surface antireflection layer, and a three layer structure having a back-surface antireflection layer between a light shielding layer and a substrate. The composition of the light shielding film in the film thickness direction may be a composition gradient film that varies continuously or in stages.

(2) A phase shift mask blank including a light-semitransmissive film formed from materials including silicon and nitrogen, or materials including a compound of transition metal and silicon (including transition metal silicide, particularly molybdenum silicide)

As such a phase shift mask blank, a halftone type phase shift mask is manufactured that is configured to have a light-semitransmissive film (thin film for forming the pattern) on a transparent substrate (glass substrate), the light-semitransmissive film patterned and provided with a shifter portion. In such a phase shift mask, to avoid pattern defects of the substrate to be transferred by the light-semitransmissive film pattern formed on the transfer region based on a light transmitted through the light-semitransmissive film, there is a configuration including a light-semitransmissive film on a transparent substrate, and further a light shielding film (light shielding band) thereon. In addition to the halftone type phase shift mask blank, there are mask blanks for an enhancer-type phase shift mask and for a Levenson type phase shift mask which is a substrate dug-down type where a transparent substrate is dug by etching, etc. to provide a shifter portion.

The light-semitransmissive film of the halftone type phase shift mask blank is adapted to transmit light having an intensity that does not substantially contribute to exposure (e.g., 1% to 30% to exposure wavelength) and has a predetermined phase difference (e.g., 180 degrees). By means of the light-semitransmissive portion onto which the light-semitransmissive film is patterned and a transparent portion formed with no light-semitransmissive film and adapted to transmit light having an intensity that substantially contributes to exposure, there is provided a relationship in which the phase of the light transmitted through the light-semitransmissive portion is substantially inverted with respect to the phase of the light transmitted through the transparent portion. As a consequence, the lights having passed near the boundaries between the light-semitransmissive portion and the transparent portion and bent into the others' regions due to the diffraction phenomenon cancel each other out. This makes the light intensity at the boundaries approximately zero to thereby improve the contrast, i.e., the resolution, at the boundaries.

The light-semitransmissive film is formed from materials including, e.g., a compound of transition metal and silicon (including transition metal silicide), the materials including, as primary components, the transition metal and silicon, and oxygen and/or nitrogen. The transition metals include molybdenum, tantalum, tungsten, titanium, hafnium, nickel, vanadium, zirconium, niobium, palladium, ruthenium, rhodium, chromium, etc. Further, in the case of a configuration where a light shielding film is formed on a light-semitransmissive film, since the materials for the light-semitransmissive film include transition metal and silicon, the material of the light shielding film preferably includes chromium, or chromium compound including chromium and elements such as oxygen, nitrogen, and carbon having etching selectivity (having etching resistance) on the light-semitransmissive film.

The light-semitransmissive film can be formed from a material containing silicon and nitrogen. Concretely, the light-semitransmissive film is formed from a material containing silicon and nitrogen, or a material containing one or more elements selected from metalloid element, non-metallic element, and noble gas added thereto. Metalloid elements included in the light-semitransmissive film preferably include one or more elements selected from boron, germanium, antimony, and tellurium. In addition to nitrogen, the light-semitransmissive film can include any non-metallic elements. Among the non-metallic elements, it is preferable to include one or more elements selected from carbon, fluorine, and hydrogen. A low transmissive layer and a high transmissive layer preferably include 10 atomic % or less oxygen, more preferably 5 atomic % or less, and further preferably avoiding positive inclusion of oxygen (the result of composition analysis such as RBS, XPS is at or below minimum limit of detection).

The light-semitransmissive film can be a structure including one or more pairs of a combination of a low transmissive layer including a relatively low amount of nitrogen and a high transmissive layer including relatively high amount of nitrogen. The matter regarding the materials of the light shielding film in the light-semitransmissive film formed from materials including silicon and nitrogen is similar to the case of the light-semitransmissive film including materials including a compound of transition metal and silicon mentioned above.

Since a Levenson type phase shift mask is manufactured from a mask blank with a structure similar to a binary mask blank, the structure of a thin film for forming the pattern is similar to a light shielding film of a binary mask blank. While a light-semitransmissive film of a mask blank for an enhancer-type phase shift mask transmits a light having an intensity that does not substantially contribute to exposure (e.g., 1% to 30% relative to exposure wavelength), the phase difference generated by the film on the transmitting exposure light is small (e.g., phase difference of 30 degrees or less, preferably 0 degree), which is the difference with the light-semitransmissive film of the halftone type phase shift mask blank. While the materials of this light-semitransmissive film include elements similar to those of the light-semitransmissive film of the halftone type phase shift mask blank, film thickness and composition ratio of each element are adjusted to a predetermined small phase difference and a predetermined transmittance with respect to exposure light.

(3) A Binary Mask Blank with a Light Shielding Film Including Materials Containing a Compound of Transition Metals and Silicon (Including Transition Metal Silicide, Particularly Molybdenum Silicide)

The light shielding film (thin film for forming the pattern) is formed from materials including a compound of transition metal and silicon. Materials can be given which include, as major components, the transition metal and silicon, and at least one or more of oxygen and nitrogen. Further, the light shielding film can be formed from materials which include, as major components, transition metal and at least one or more of oxygen, nitrogen, and boron. Molybdenum, tantalum, tungsten, titanium, hafnium, nickel, vanadium, zirconium, niobium, palladium, ruthenium, rhodium, chromium, etc. can be applied as the transition metal. Particularly, there are cases where a light shielding film is formed from a compound of molybdenum silicide, including two-layer structure of a light shielding layer (MoSi, etc.) and a front-surface antireflection layer (MoSiON, etc.), and three layer structure further including a back-surface antireflection layer (MoSiON, etc.) between a light shielding layer and a substrate. The composition of the light shielding film in the film thickness direction may be a composition gradient film that varies continuously or in stages.

Further, for thinning the film thickness of a resist film to form a fine pattern, a light shielding film can be configured to have an etching mask film thereon. This etching mask film is preferably formed from materials including, particularly, chromium having etching selectivity (having etching resistance) to etching of a light shielding film including transition metal silicide, and a chromium compound including chromium and elements such as oxygen, nitrogen, and carbon added thereto. At this stage, a transfer mask can be manufactured with the etching mask film remaining on the light shielding film by providing antireflection function to the etching mask film.

In (1) to (3) above, an etching stopper film having etching resistance on the light shielding film and the light-semitransmissive film can be provided between the transparent substrate (glass substrate) and the light shielding film, or between the light-semitransmissive film and the light shielding film. The etching stopper film can be made of a material capable of simultaneously peeling off the etching mask film in etching the etching stopper film.

[Transfer Mask and its Manufacturing Method]

The transfer mask of this invention is characterized in that a transfer pattern is formed on a thin film of the mask blank mentioned above. Further, the manufacturing method of the transfer mask of this invention is characterized in including the step of forming a transfer pattern on the thin film of the mask blank manufactured by the manufacturing method of the mask blank mentioned above. Explanation is made below on the steps of manufacturing a transfer mask from a mask blank. The mask blank used herein is the phase shift mask blank mentioned above in (2), including a structure where a light-semitransmissive film (thin film for forming a transfer pattern) and a light shielding film are laminated on a transparent substrate in order. Further, the manufacturing method of this transfer mask (phase shift mask) is one example, which can be manufactured by changing a part of the procedures.

First, a resist film is formed on a light shielding film of a phase shift mask blank by spin coating. A chemically amplified resist for electron beam exposure writing is preferably used for the resist film. Next, a transfer pattern to be formed on the light-semitransmissive film is exposed and drawn with an electron beam on the resist film, and a predetermined process such as developing is conducted to thereby form a resist pattern having a transfer pattern. Subsequently, dry etching is conducted on the light shielding film using the resist pattern as a mask, and the transfer pattern to be formed on the light-semitransmissive film is formed on the light shielding film. After dry etching, the resist pattern is removed. Next, dry etching is conducted on the light-semitransmissive film using the light shielding film having the transfer pattern as a mask to form a transfer pattern on the light-semitransmissive film. Subsequently, a resist film is again formed by spin coating, pattern to be formed on the light shielding film (pattern for light shielding band, etc.) is exposed and drawn with an electron beam, and a predetermined process such as developing is conducted to thereby form a resist pattern. Dry etching is conducted on the light shielding film using the resist pattern having a pattern such as a light shielding band as a mask, and a pattern such as a light shielding band is created on the light shielding film. Then, a predetermined cleaning process is conducted so that the transfer mask (phase shift mask) is formed.

The optical flatness of the exposed face (substrate principal surface of an opening with no remaining thin film for forming the pattern) of the substrate of the transfer mask manufactured by this method is as high as one-eighth or less of the exposure wavelength λ, allowing the manufacture of a transfer mask with sufficient wavefront control. Due to the sufficient wavefront control, when this transfer mask is used for exposure, excellent focal depth, inhibition of positional displacement, and resolution were achieved, also stabilizing circuit characteristics of a semiconductor device manufactured using the same.

This invention is effective irrespective of the type of the transfer mask, which is also effective for a binary mask, halftone type phase shift mask, enhancer-type mask, and Levenson type phase shift mask.

Figure 21:
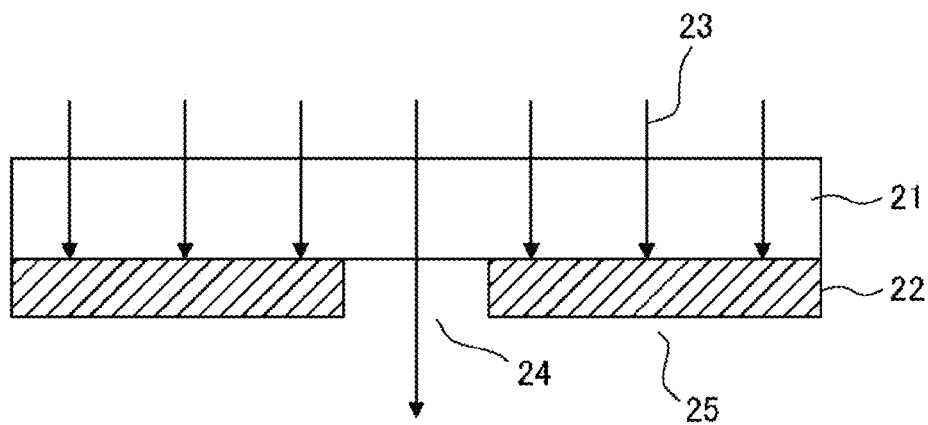
FIG. 21 is a cross-sectional structure of a principal part of a mask for explaining the characteristic of an exposure light upon use of a binary mask.
Figure 22:
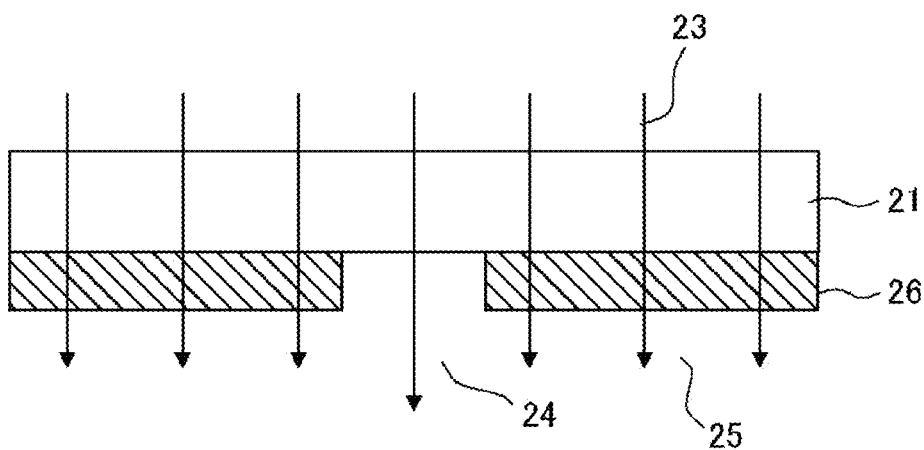
FIG. 22 is a cross-sectional structure of a principal part of a mask for explaining the characteristic of an exposure light upon use of a halftone type phase shift mask.

Among the above, a binary mask is most generally used, having significant volume efficiency since there is no need to create a light shielding band with a particular method. Regarding a halftone type phase shift mask, due to the significant influence of wavefront control on transfer properties due to transmission of exposure light through not only the pattern opening but also through the light-semitransmissive portion, a transfer mask manufactured by this method is particularly effective. The above is explained with reference to FIGS. 21 and 22 showing a cross-sectional view of a transfer mask. FIG. 21 depicts the case of a binary mask including a transparent mask blank substrate 21 and a light shielding film pattern 22. An exposure light 23 transmits through a pattern opening 24, but not the portion with the light shielding film pattern 22, so-called a field portion 25. Thus, the pattern opening 24 is the only portion where the wavefront control of the exposure light is effective. On the other hand, FIG. 22 shows the case of a halftone type phase shift mask which, while light is reduced in a light-semitransmissive pattern 26, the exposure light 23 transmits therethrough. Namely, since the exposure light transmits not only through the pattern opening 24 but also through the field portion 25, wavefront control on the entire surface of the mask is important, significantly showing the effect of this invention. Moreover, wavefront control is important due to the principle of the halftone type phase shift mask.

[Exposure Method and Manufacturing Method of Device Using the Same]

Exposure method using the mask manufactured by the method mentioned above and the manufacturing method of a device using the same are mentioned below.

Figure 23:
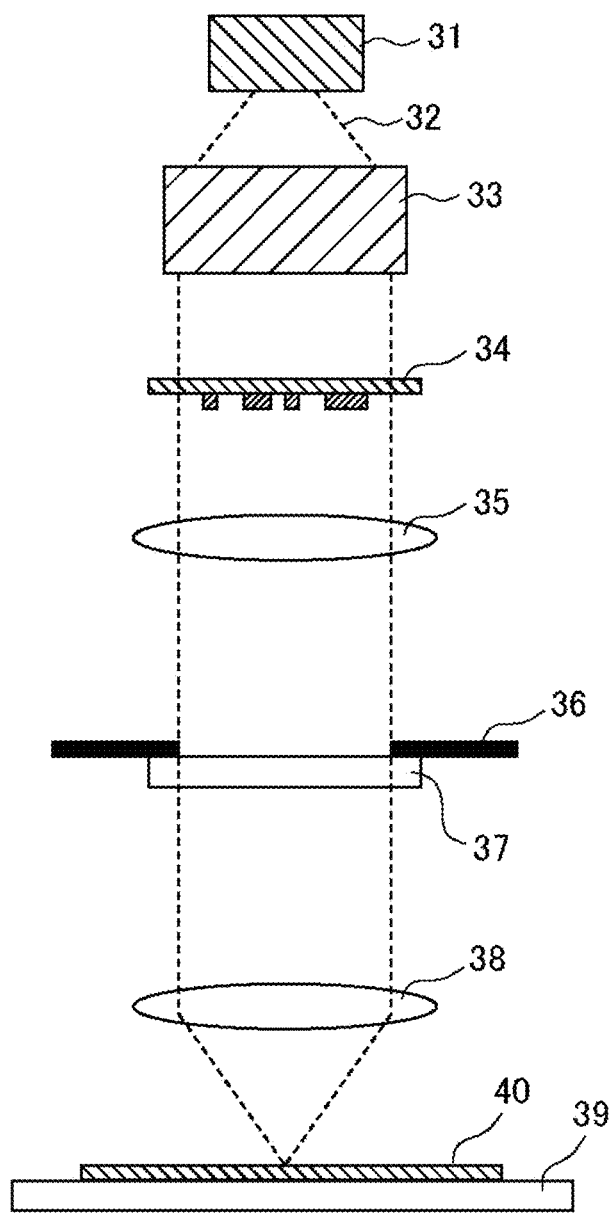
FIG. 23 is a cross-sectional structure of a principal part of an optical portion of an exposure apparatus showing an outline of the structure of an illumination of an exposure apparatus and a projection optical system.

First, explanation is made on the summary of an optical system portion of an exposure apparatus with reference to FIG. 23 showing a cross-sectional view of the outline of the device structure. The optical system portion of the exposure apparatus is configured as follows. An exposure light 32 is emitted from a light source 31, and the exposure light is irradiated through an illumination optical system 33 and onto a transfer mask 34. The exposure light transmitted through the transfer mask 34 is irradiated via projection lenses 35 and 38 and onto a wafer 40 placed on a wafer stage 39 to carry out an exposure. A pupil 36 portion between the projection lenses 35 and 38 is normally provided with a movable diaphragm for adjusting the numerical aperture (NA) of the projection lens. While the projection lenses 35 and 38 are respectively depicted as one lens in this drawing, the lenses are actually made up of a group of multiple lenses, incorporating a mechanism allowing correction of lens aberration centered on the lower order by partially slightly moving the relative positions of the lenses. Further, a phase filter 37 is incorporated in the vicinity of the pupil 36 in which, by adjusting the phase filter 37, a high order lens aberration, particularly high order aberration due to partial lens heating, can be corrected in real time.

This lower order lens aberration correction includes up to the sixth term of Zernike polynomial such as tilt and astigmatism. Namely, there is a function to correct the term defined by the Zernike polynomial which is composed of only terms in which the order of a variable related to a radius is the second or lower order, and includes one or more terms in which the order of the variable related to the radius is the second order. By using the transfer mask of this invention, the principal surface of the transfer mask can be brought to a position where the principal surface is conjugate with the top of the wafer 40 with respect to the projection lenses 35, 38 by the lower order lens aberration correction, so that the principal surface of the transfer mask becomes an optically flat surface. Therefore, by using this transfer mask for exposure, excellent focal depth, inhibition of positional displacement, and resolution can be achieved, also stabilizing circuit characteristics of a semiconductor device manufactured using the same. The installation (setting) of the transfer mask on the mask stage can be made either by so-called a soft chuck or a hard chuck.

Figure 24:
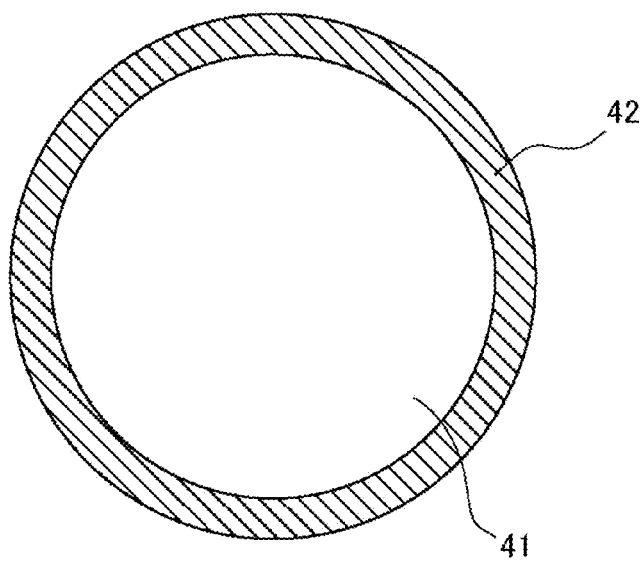
FIG. 24 is an illumination distribution showing an illumination shape of a normal illumination.
Figure 25:
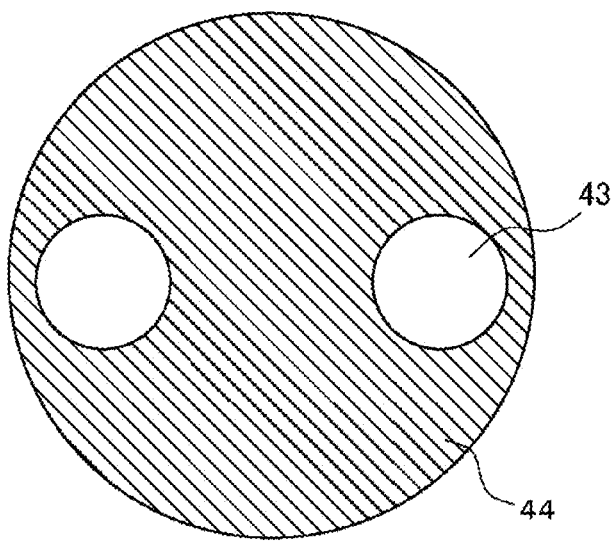
FIG. 25 is an illumination distribution showing an illumination shape of X dipole illumination.
Figure 26:
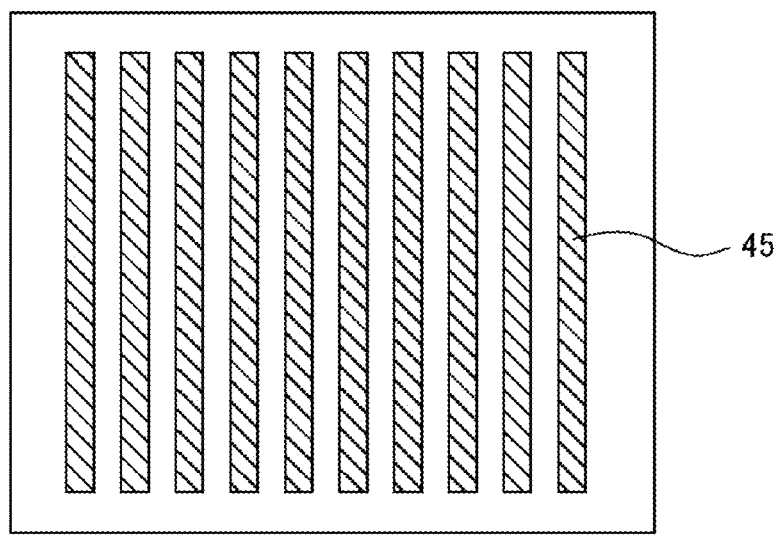
FIG. 26 is the top view of a resist pattern transferred and formed on a wafer.

The illumination optical system 33 has incorporated therein a zooming mechanism, movable multi-mirror optical system, etc., enabling installment of a desired shape of illumination. FIG. 24 shows an example of a normal illumination which includes an illumination portion 41 and a light shielding portion (portion shielded from light) 42. The illumination portion is in a circular shape with its central portion as the center, which defines an illumination condition with the size of the circle (referred to as coherency). On the other hand, what has been often used recently, particularly in memory-based devices, is a dipole illumination, an example of which is shown in FIG. 25. This is called an X dipole, in which a small illumination portion in circular shape is placed away from the central portion on X axis, surrounded by a light shielding portion 44. A deformed dipole illumination is also often used in which the illumination portion is deformed into a fan-shape, etc. from a circle. The X dipole illumination has high resolution in X direction, suitable in forming a dense, fine pattern in X direction as shown in FIG. 26. Reference numeral 45 in the drawing shows a resist pattern. The illumination optical system 33 has incorporated therein a mechanism to improve irradiation efficiency by concentrating the illumination normally directed to the light shielding portion (field portion)

Figure 27:
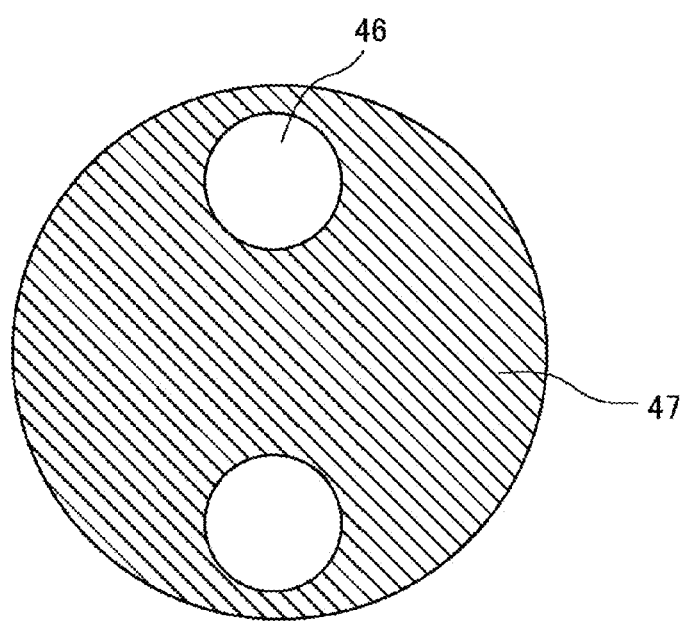
FIG. 27 is an illumination distribution showing an illumination shape of Y dipole illumination.
Figure 28:
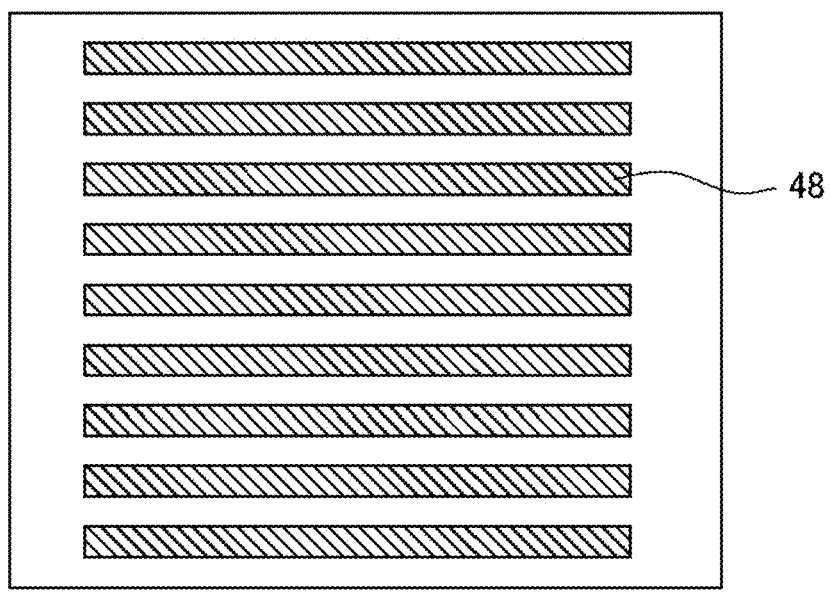
FIG. 28 is the top view of a resist pattern transferred and formed on a wafer.

44 to the illumination portion 43 during the X dipole illumination. Therefore, in the projection lenses 35 and 38, a strong exposure light intensively transmits through a portion of the lenses, causing partial lens heating. Deformation of the lens due to this heat causes complex high order lens aberration. Further, in manufacture of devices, not only the X dipole illumination but also Y dipole illumination shown in FIG. 27 is often used. Reference numeral 46 in the drawing is an illumination portion, and 47 is a light shielding portion (field portion). This case is suitable for forming a dense, fine pattern in the Y direction as shown in FIG. 28. While a fine pattern is particularly demanded on word line and bit line in a memory, they are normally arranged in an orthogonal relationship, namely, a wiring dense in X direction and wiring dense in Y direction. For such a reason, both X dipole illumination and Y dipole illumination are often used. Further, in forming patterns of various shapes such as in a logic pattern, normal illumination is often used. Since various illuminations are used as mentioned, lens heating occurs in various sites, causing generation of various high order aberration of lens. Since heating causes generation of different high order aberrations during a large amount of processing subsequent to commencement of the exposure, it is necessary that high order lens aberration correction follows the chronological change. This high order aberration correction is, when expressed by a Zernike polynomial, a term of third order or more in a radial direction, the term being corrected sequentially. Therefore, correcting an optically flat surface of a transfer mask up to a term of a third order or more in a radial direction in Zernike polynomial only creates an optical flatness in an illumination condition at a certain time point, and does not cause a sufficient wavefront control in various use conditions. Therefore, as mentioned above, it is most efficient and effective to configure an optically flat surface as a virtual reference surface of a transfer mask with a Zernike polynomial which is composed of only terms in which the order of a variable related to a radius is the second or lower order, and includes one or more terms in which the order of the variable related to the radius is the second order.

Three application examples of applying exposure are given below.

<Example of Avoiding Sub Peak Transfer of Halftone Type Mask>

Figure 29A:
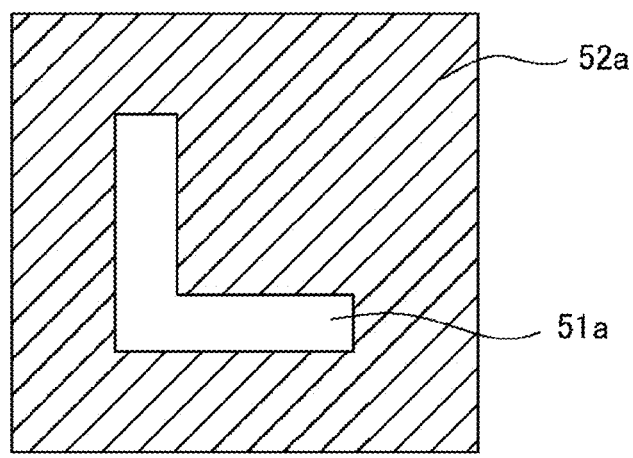
FIG. 29A is a mask top view showing a pattern laid out on a mask.
Figure 29B:
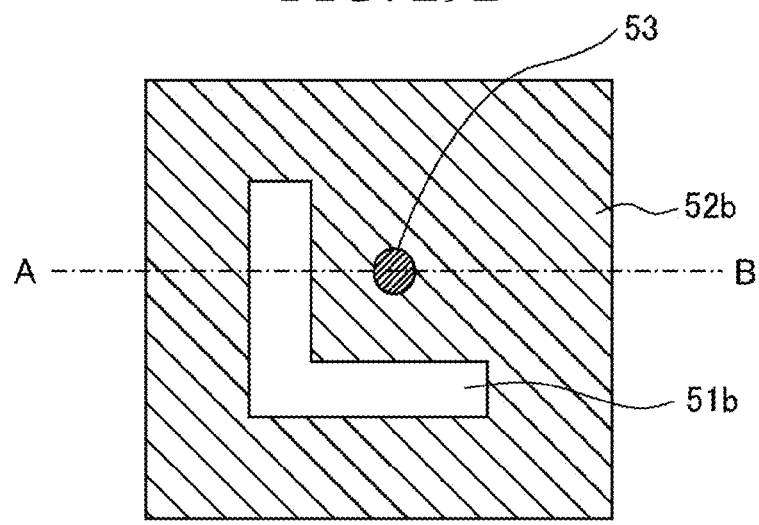
FIG. 29B is the top view of a resist pattern formed when transferred on a wafer using the mask of FIG. 29A.
Figure 29C:
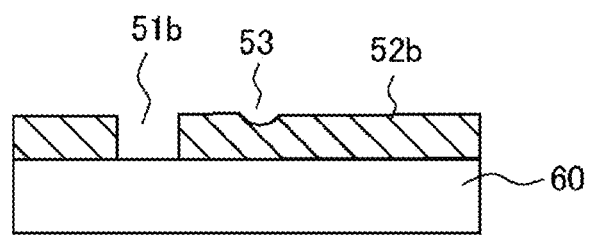
FIG. 29C is a cross-sectional view of the resist pattern of FIG. 29B.
Figure 30A:
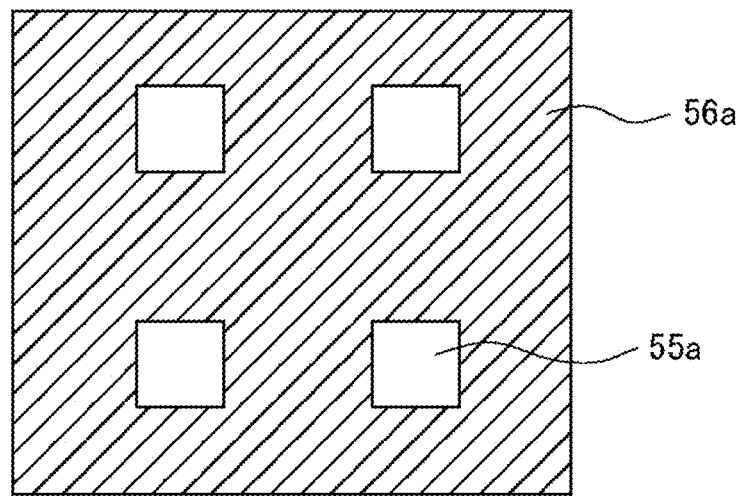
FIG. 30A is a mask top view showing a pattern laid out on a mask.
Figure 30B:
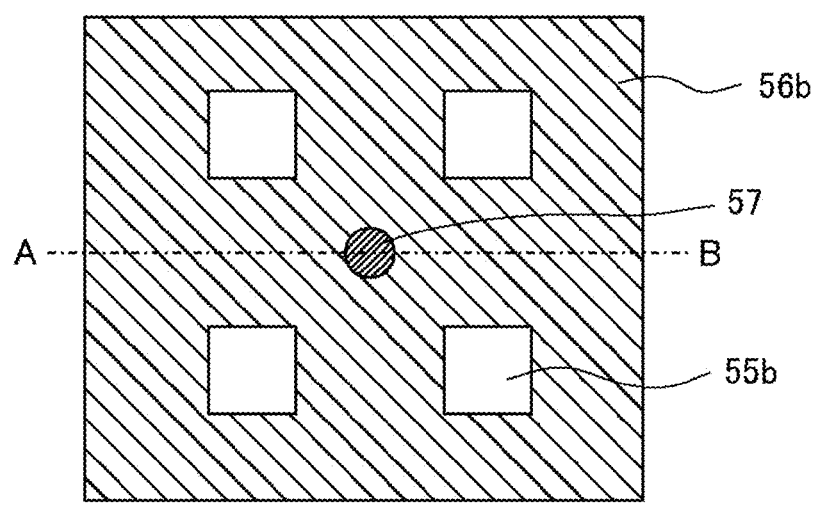
FIG. 30B is the top view of a resist pattern formed when transferred on a wafer using the mask of FIG. 30A.
Figure 30C:
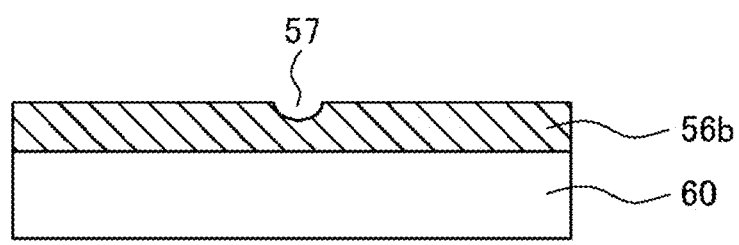
FIG. 30C is a cross-sectional view of the resist pattern of FIG. 30B.

Described below is an example of which sub peak transfer defect has been improved, which frequently causes a problem in using a halftone type mask. FIGS. 29A to 29C are an example where a pattern of a wire layer is transferred using a halftone type phase shift mask. FIG. 29A is the top view of a principal part of a halftone type phase shift mask, in which 51a is an opening and 52a is a field portion (light-semitransmissive portion) by a light-semitransmissive film; and FIG. 29B is the top view of a resist pattern transferred and formed on a wafer. Further, a cross-sectional view cut along A-B in FIG. 29B is shown in FIG. 29C. When a positive resist is used as a resist of a wafer, the resist pattern to be formed is a desired opening 51b formed inside of a resist portion 52b. However, due to a sub peak phenomenon, a resist recess 53 generates at a location that should be a resist portion. This recess causes penetration during etching of a film to be processed and creates a base of defects of a device circuit, dropping production yield of the devices and causing instability of circuit operation. Another similar example is given in FIGS. 30A to 30C, showing an example of a hole and a via layer, in which FIG. 30A is the top view of a principal part of a halftone type phase shift mask where 55a is a pattern opening and 56a is a field portion (light-semitransmissive portion) by a light-semitransmissive film, and FIG. 30B is the top view of a resist pattern transferred and formed on a wafer. Further, FIG. 30C is a cross-sectional view taken along A-B of FIG. 30B. Similarly, while the resist pattern to be formed is a desired opening 55b formed inside of a resist portion 56b, due to a sub peak phenomenon, a resist recess 57 generates at a location that should be a resist portion. This recess causes penetration during etching of a film to be processed and creates a base of defects of a device circuit, dropping production yield of the devices and causing instability of circuit operation. While this problem can be solved by increasing the thickness of the resist film, thickening the resist is difficult due to problems in resist resolution and pattern collapse. While one of the methods for solving this problem is to provide lower order aberration to the lens to interrupt sub peak, this method causes a decrease in exposure latitude, particularly focus latitude. Therefore, flatness is more strictly demanded to a mask blank substrate and a transfer mask. Thus, using the mask blank substrate and the transfer mask of this embodiment, for the purpose of providing an optically flat surface to the mask blank substrate and the transfer mask, a lower order aberration correction defined by a Zernike polynomial which is composed of only terms in which the order of a variable related to a radius is the second or lower order and includes one or more terms in which the order of the variable related to the radius is the second order was added to the projection lens, and exposure was made by further adding to the correction a lower order correction for avoiding sub peak transfer. As a result, the problem of the sub peak transfer upon the use of the halftone type phase shift mask was avoided, while securing necessary focus latitude. This is due to the achievement of an optical flatness of $\lambda/8$ or less in the mask blank substrate and the transfer mask in this embodiment.

<Example of Application to QC of Exposure Apparatus>

Described below is an example for application to QC (Quality Control) of an exposure apparatus. While high order aberration correction of a projection lens of an exposure apparatus is sequentially adjusted in accordance with exposure condition as stated above, a term of lower order described by a Zernike polynomial, which is composed of only terms in which the order of a variable related to a radius is the second or lower order, and includes one or more terms in which the order of the variable related to the radius is the second order, is changed in accordance with an application layer of a semiconductor device as mentioned above; on the other hand, in light of exposure apparatus control, reference value should be operated in semi-fixed manner. While these lower order lens aberration corrections normally do not change over time, a change occurs due to power failure, temperature environment change of the exposure apparatus due to abnormal stop of temperature control chamber, earthquakes, etc. Thus, there is a requirement for QC of a lower order lens aberration correction control of an exposure apparatus. QC requires a reference mask that is extremely flat and which does not form the basis of wavefront aberration. For a lens aberration evaluation, the reference mask used therein requires flatness of an optical flatness of $\lambda/8$ or less similar to the requirement for an advanced optical measurement device. The mask blank substrate and the transfer mask of this embodiment satisfy this requirement, which were most suitable for adjusting a lens aberration correcting function of an exposure apparatus.

<Example of Application to Exposure Apparatus Lens Aberration Correcting Function Adjustment>

An example for application to adjusting lens aberration correcting function of an exposure apparatus is given below. As stated above, the exposure apparatus has incorporated therein a lens aberration correcting function. In adjusting and evaluating this function, a reference mask that is extremely flat and does not form the basis of wavefront aberration is required. For a lens aberration evaluation, the reference mask used therein requires flatness of an optical flatness of λ/8 or less similar to the requirement for an advanced optical measurement device. The mask blank substrate and the transfer mask of this embodiment satisfy this requirement, which were most suitable for adjusting a lens aberration correcting function of an exposure apparatus.

EXAMPLES

Examples, Comparative Examples, Reference Examples

[Manufacture of Mask Blank Substrate]

Eight samples of mask blank substrate were manufactured in accordance with the manufacturing method of the mask blank substrate of this embodiment, and were evaluated. Three samples including Samples A, B, and D are Examples, three samples including Samples X1, X3, and Y are Comparative Examples, and two samples including Samples C and X2 are Reference Examples. The eight samples were all manufactured through the identical steps shown below up to the flatness measurement of the substrate.

First, a synthetic quartz glass substrate (size: 152.4 mm×152.4 mm, thickness: 6.35 mm) was cut out, end faces of which were chamfered and ground, further rough-polished and precision-polished using polishing liquid containing cerium oxide grains. Thereafter, the glass substrate was placed in a carrier of a double side polishing apparatus and superprecision polishing was conducted under the condition below.

polishing pad: soft polisher (suede type)
polishing liquid: colloidal silica grain (average particle size 100 nm)+water
processing pressure: 50-100 g/cm$^2$
processing time: 60 minutes After the completion of superprecision polishing, the glass substrate was immersed in dilute hydrofluoric acid for cleaning to remove the colloidal silica grains. Subsequently, the principal surface and the end face of the glass substrate were scrub-cleaned, followed by spin-cleaning with pure water, and spin-dried, so that eight glass substrates with polished surfaces were prepared. Thereafter, the surface shape (flatness) of the glass substrates was actually measured using a flatness measuring device (UltraFlat200M manufactured by Corning Tropel Corp.).

The actual measurement data is shown in FIGS. 4A to 4C, FIGS. 6A to 6C, FIGS. 8A to 8C, FIGS. 10A to 10C, FIGS. 12A to 12C, FIGS. 14A to 14C, FIGS. 16A to 16C, and FIGS. 18A to 18C, each showing the cases of Samples A and B of Examples, Sample C of Reference Examples, Sample X1 of Comparative Examples, Sample X2 of Reference Examples, Sample X3 of Comparative Examples, Sample D of Examples, and Sample Y of Comparative Examples, respectively, in which FIG. 4A, FIG. 6A, FIG. 8A, FIG. 10A, FIG. 12A, FIG. 14A, FIG. 16A, and FIG. 18A show contour distributions viewed from the top surface of the principal surface shape actually measured, FIG. 4B, FIG. 6B, FIG. 8B, FIG. 10B, FIG. 12B, FIG. 14B, FIG. 16B, and FIG. 18B show height distribution curves in a diagonal direction, and FIG. 4C, FIG. 6C, FIG. 8C, FIG. 10C, FIG. 12C, FIG. 14C, FIG. 16C, and FIG. 18C are height distribution curves along vertical and horizontal axes traversing the center of a glass substrate. The unit of the vertical axis and horizontal axis in the plan view at the left hand side of each of FIG. 4A, FIG. 6A, FIG. 8A, FIG. 10A, FIG. 12A, FIG. 14A, FIG. 16A, and FIG. 18A indicates the number of pixels of the measurement device used in flatness measurement. The size of the pixel is 0.77 mm per pixel. Therefore, an inner region of a square shape of 146 mm×146 mm based on the center of the glass substrate is measured. The contour is plotted for each 10 nm. The unit of Z at the right hand side is μm. Horizontal axis in each of FIG. 4B, FIG. 6B, FIG. 8B, FIG. 10B, FIG. 12B, FIG. 14B, FIG. 16B, and FIG. 18B and each of FIG. 4C, FIG. 6C, FIG. 8C, FIG. 10C, FIG. 12C, FIG. 14C, FIG. 16C, and FIG. 18C is the number of pixels used in flatness measurement, the vertical axis showing the height and its unit is μm.

For the six glass substrates in Samples A, B of Examples, Sample C of Reference Examples, Sample X1 of Comparative Examples, Sample X2 of Reference Examples, and Sample X3 of Comparative Examples, the principal surface and the virtual reference surface were fitted in a circular region of 104 mm diameter based on the center of the substrate to calculate difference shape (difference data). Examples of the principal surface shape of which surface shape distribution in a circular region of 104 mm diameter based on the center of the glass substrate is re-displayed are shown in FIGS. 5A to 5C, FIGS. 7A to 7C, FIGS. 9A to 9C, FIGS. 11A to 11C, FIGS. 13A to 13C, and FIGS. 15A to 15C. The drawings show the cases on Samples A and B of Examples, Sample C of Reference Examples, Sample X1 of Comparative Examples, Sample X2 of Reference Examples, and Sample X3 of Comparative Examples, respectively, in which FIG. 5A, FIG. 7A, FIG. 9A, FIG. 11A, FIG. 13A, and FIG. 15A are contour distributions of the principal surface shape actually measured (principal surface actually measured), FIG. 5B, FIG. 7B, FIG. 9B, FIG. 11B, FIG. 13B, and FIG. 15B are contour distributions of a virtual reference surface (104 mm in diameter) defined by a Zernike polynomial which is composed of only terms in which the order of a variable related to a radius is the second or lower order, and includes one or more terms in which the order of the variable related to the radius is the second order, and FIG. 5C, FIG. 7C, FIG. 9C, FIG. 11C, FIG. 13C, and FIG. 15C are contour distributions of difference shape (difference data) between the virtual reference surface and the principal surface actually measured.

Figure 17A:
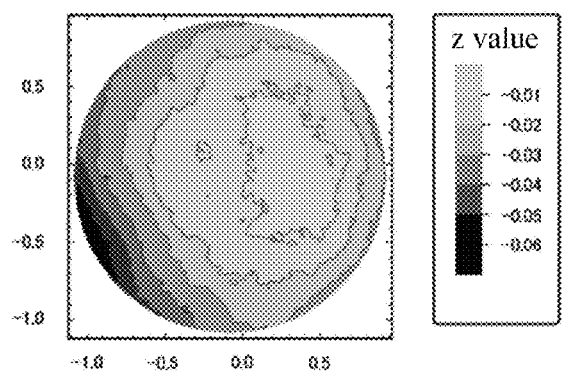
FIG. 17A is a contour distribution showing a surface shape distribution of Sample D of Examples, which is a contour distribution showing a measured shape within 90 mm diameter.
Figure 17B:
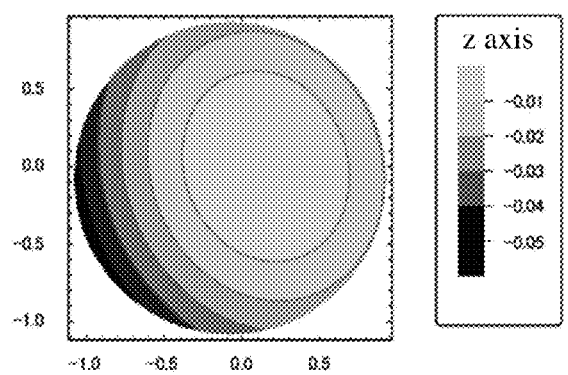
FIG. 17B is a contour distribution showing a surface shape distribution of Sample D of Examples, which is a contour distribution of a virtual reference surface corresponding to the measured shape within 90 mm diameter.
Figure 17C:
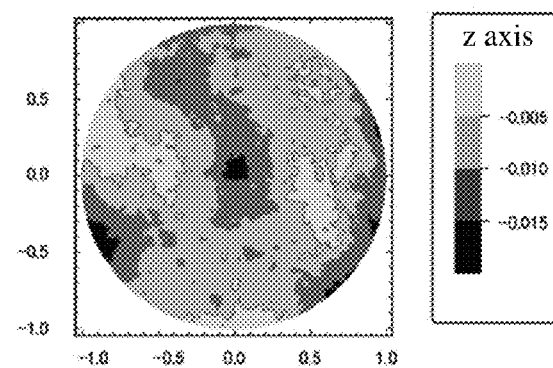
FIG. 17C is a contour distribution showing a surface shape distribution of Sample D of Examples, which is a difference shape contour distribution showing the difference between actual measurement and the virtual reference surface.
Figure 18A:
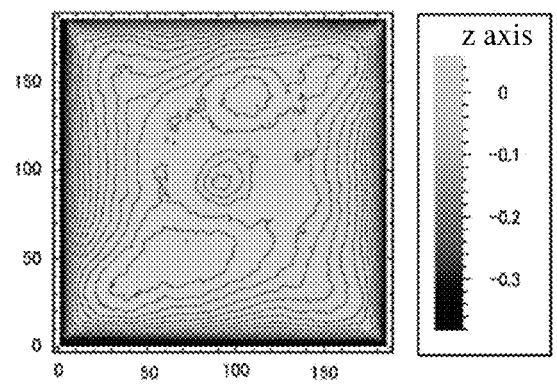
FIG. 18A is a principal surface shape distribution of the mask blank substrate of Sample Y of Comparative Examples, which is a surface height contour distribution viewed from the top surface of the mask blank.
Figure 18B:
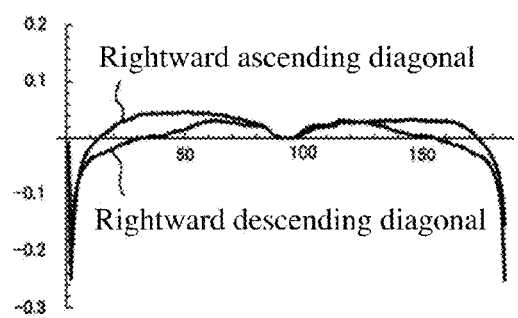
FIG. 18B is a principal surface shape distribution of the mask blank substrate of Sample Y of Comparative Examples, which is a height distribution property curve in a diagonal direction.
Figure 18C:
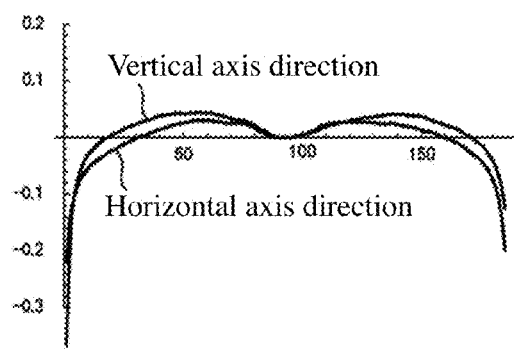
FIG. 18C is a principal surface shape distribution of the mask blank substrate of Sample Y of Comparative Examples, which is a height distribution property curve of a central portion of the mask blank cut vertically and horizontally.
Figure 19A:
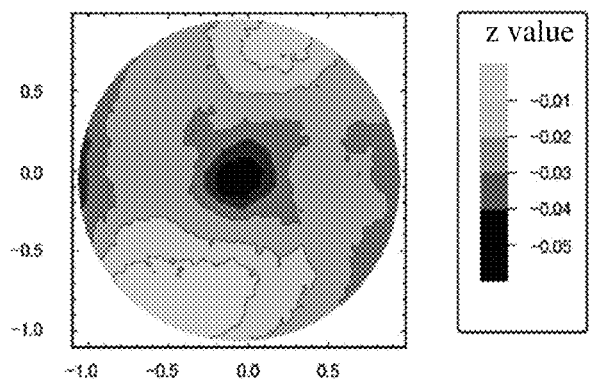
FIG. 19A is a contour distribution showing a surface shape distribution of Sample Y of Comparative Examples, which is a contour distribution showing a measured shape within 90 mm diameter.
Figure 19B:
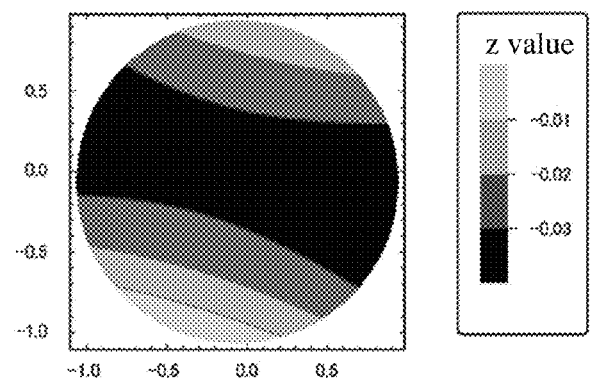
FIG. 19B is a contour distribution showing a surface shape distribution of Sample Y of Comparative Examples, which is a contour distribution of a virtual reference surface corresponding to the measured shape within 90 mm diameter.
Figure 19C:
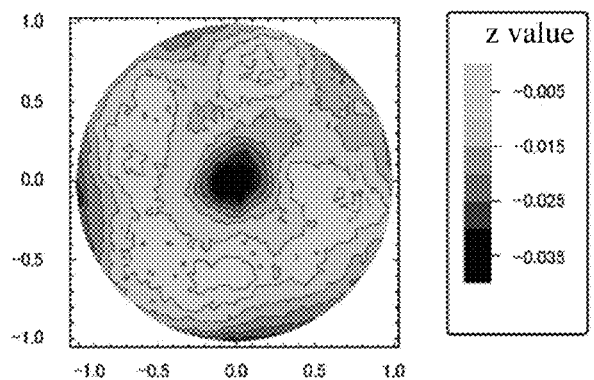
FIG. 19C is a contour distribution showing a surface shape distribution of Sample Y of Comparative Examples, which is a difference shape contour distribution showing the difference between actual measurement and the virtual reference surface.

For the two glass substrates in Sample D of Examples and Sample Y of Comparative Examples, the principal surface and the virtual reference surface were fitted in a circular region of 90 mm diameter based on the center of the substrate to calculate difference shape (difference data). Examples of the principal surface shape of which surface shape distribution in a circular region of 90 mm diameter based on the center of the glass substrate is re-displayed are shown in FIGS. 17A to 17C for Sample D of Examples, and FIGS. 19A to 19C for Sample Y of Comparative Examples. FIG. 17A and FIG. 19A are contour distributions of the principal surface shape actually measured (principal surface actually measured), FIG. 17B and FIG. 19B are contour distributions of a virtual reference surface (90 mm diameter) defined by a Zernike polynomial which is composed of only terms in which the order of a variable related to a radius is the second or lower order, and includes one or more terms in which the order of the variable related to the radius is the second order, and FIG. 17C and FIG. 19C are contour distributions of a difference shape (difference data) between the virtual reference surface and the principal surface actually measured.

The Zernike polynomial used herein is described in The University of Arizona style, where fitting was made using the first to sixth terms for approximation to the measured shape to create a virtual reference surface. However, as stated above, this is only an example and the Zernike polynomial is not limited to The University of Arizona style. It is possible to obtain a similar virtual reference surface by using other description style such as standard Zernike and fringe Zernike. The contour is plotted for each 5 nm.

The terms of the Zernike polynomial described in The University of Arizona style used in Examples, etc. are as shown in Table 1. Each term is described in a polar coordinate system in which the radius is ρ, and the phase (azimuth) is θ. In Table 1, j represents the number of a term (j term), and Zj(ρ,θ) is the content of the term of the number. While Table 1 includes up to ten terms for reference, terms up to the sixth are used in Examples, etc.

TABLE 1

| j | n | m | $Z_j(\rho, \theta)$ |
|---|---|---|---|
| 1 | 0 | 0 | 1 |
| 2 | 1 | 1 | $2\rho \cos \theta$ |
| 3 | 1 | 1 | $2\rho \sin \theta$ |
| 4 | 2 | 0 | $\sqrt{3}(2\rho^2 - 1)$ |
| 5 | 2 | 2 | $\sqrt{6}\rho^2 \sin 2\theta$ |
| 6 | 2 | 2 | $\sqrt{6}\rho^2 \cos 2\theta$ |
| 7 | 3 | 1 | $\sqrt{8}(3\rho^3 - 2\rho) \sin 2\theta$ |
| 8 | 3 | 1 | $\sqrt{8}(3\rho^3 - 2\rho) \cos 2\theta$ |
| 9 | 3 | 3 | $\sqrt{8}\rho^3 \sin 3\theta$ |
| 10 | 3 | 3 | $\sqrt{8}\rho^3 \cos 3\theta$ |

Examples

The values of the mechanical flatness of Samples A and B in Examples were, as represented by TIR (Total Indicator Reading) which is a sum of absolute value of highest point and absolute value of lowest point, 216 nm and 249 nm respectively in the case of 146 mm×146 mm region. In the case of 132 mm×132 mm region within which a transfer exposure region (shot region) fits, the values were 138 nm and 148 nm respectively, both being 200 nm or less. Further, the values were 55 nm and 46 nm respectively in the case of a circular region of 104 mm diameter. The minimum value of the mechanical flatness of the two samples is 46 nm in the case of a circular region of 104 mm diameter, which was approximately twice the value 25 nm (rounded up to whole number) which is λ/8 of exposure wavelength λ (193 nm) of ArF exposure.

On the other hand, in view of the optical flatness of this invention calculated by the difference shape (difference data) between the virtual reference surface and the principal surface actually measured, PV value, a flatness index within a circular region of 104 mm diameter, was 14 nm and 15 nm for Samples A and B of Examples, respectively. By this method, both Samples A and B of Examples achieved a value significantly lower than 25 nm (rounded up to whole number) which is λ/8 of exposure wavelength λ of ArF exposure, so that a mask blank substrate with extremely high optical flatness even lower than λ/10 was selected and obtained.

Figure 20:
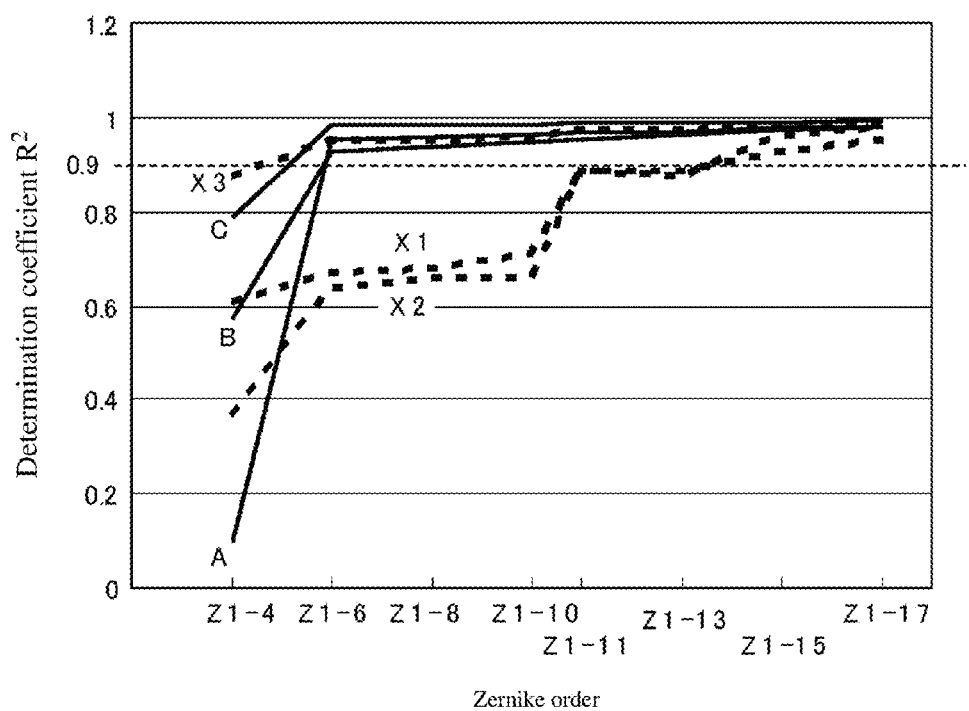
FIG. 20 is a property diagram showing Zernike polynomial order dependency of difference shape data.

FIG. 20 shows a determination coefficient $R^2$ of difference shape (difference data) between the virtual reference surface and the principal surface actually measured. In the drawing, in calculating the virtual reference surface, calculation was made from the case where first to fourth orders of Zernike polynomial were used (corresponding to "Z1-4" in the drawing) to the case where 1 to 17 (corresponding to "Z1-17" in the drawing) were used. The University of Arizona style was used as the Zernike polynomial. In all Samples A, B, C, X1, X2, and X3, the determination coefficient $R^2$ approximated closer to 1 as the term of higher order was used; particularly, the determination coefficient $R^2$ exceeded 0.9 when fifteenth or more term was used. On the other hand, when a virtual reference surface of a mask blank substrate is adjusted using a term with higher order beyond sixth order as mentioned above, due to the change in aberration correction of the projection lens caused by exposure condition, no effect is obtained although requires labor. In the selection of a mask blank substrate using first to sixth terms of a Zernike polynomial which is composed of only terms in which the order of a variable related to a radius is the second or lower order, and includes one or more terms in which the order of the variable related to the radius is the second order (corresponding to "Z1-6" in the drawing), Samples A, B, C, and X3 were obtained of which the determination coefficient $R^2$ goes beyond 0.9. However, as shown in Comparative Examples mentioned below, PV value of Sample X3 of Comparative Examples is 26 nm which is beyond λ/8. Further, while Sample C of Reference Examples satisfied the selection reference value in the determination coefficient $R^2$ and the optical flatness of a circular region of 104 mm diameter as will be described below, the mechanical flatness in 132 mm×132 mm region was 281 nm, which did not fall under 200 nm or less.

Samples A and B of Examples, the high flatness mask blank substrate obtained by selection, have wavefront aberration of λ/8 or less within 104 mm diameter circle, with the determination coefficient $R^2$ beyond 0.9, and the mechanical flatness in the case of 132 mm×132 mm region is 0.2 μm or less. When exposed using a mask manufactured using this mask blank substrate, excellent focus latitude, inhibition of positional displacement, and resolution were achieved, also stabilizing circuit characteristics of a semiconductor device manufactured using the same as mentioned above in [Exposure Method and Manufacturing Method of a Device Using the Same].

On the other hand, the mechanical flatness of Sample D as another example was, as represented by TIR (Total Indicator Reading) which is a sum of absolute value of the highest point and absolute value of the lowest point, 422 nm in the case of 146 mm×146 mm region. In the case of 132 mm×132 mm region within which a transfer exposure region (shot region) fits, the value was 167 nm, being 200 nm or less. Further, the case of a circular region of 90 mm diameter was 63 nm, the value of which was twice or more the value 25 nm (rounded up to whole number) which is λ/8 of exposure wavelength λ (193 nm) of ArF exposure.

In view of the optical flatness of this invention calculated by the difference shape (difference data) between the virtual reference surface and the principal surface actually measured, PV value which is one of the flatness indexes was 17 nm within a circular region of 90 mm diameter for Sample D of Examples. By this method, Sample D of Examples achieved a value significantly lower than 25 nm (rounded up to whole number) which is λ/8 of exposure wavelength λ of ArF exposure, so that a mask blank substrate with extremely high optical flatness even lower than λ/10 was selected and obtained. Further, the determination coefficient $R^2$ of the difference shape (difference data) between the virtual reference surface and the principal surface actually measured in Sample D of Examples was 0.943, beyond 0.9.

Sample D of Examples, the high flatness mask blank substrate obtained by selection, has wavefront aberration of λ/8 or less within 90 mm diameter circle, with the determination coefficient $R^2$ beyond 0.9, and the mechanical flatness in the case of 132 mm×132 mm region is 0.2 μm or less. When exposed using a mask manufactured using this mask blank substrate, excellent focus latitude, inhibition of positional displacement, and resolution were achieved, also stabilizing circuit characteristics of a semiconductor device manufactured using the same as mentioned above in [Exposure Method and Manufacturing Method of a Device Using the Same].

Comparative Examples

The values of the mechanical flatness of Samples X1 and X3 of Comparative Examples were, as represented by TIR, 163 nm and 282 nm respectively in the case of 146 mm×146 mm region, and 71 nm and 239 nm respectively in the case of 132 mm×132 mm region. The TIR value 71 nm of Sample X1 of Comparative Examples in 132 mm×132 mm region is approximately half the values 138 nm of Sample A and 148 nm of Sample B in Examples. Further, in the case of a circular region of 104 mm diameter, the values were 40 nm and 75 nm, respectively. The value 40 nm in Sample X1 of Comparative Examples is also superior to 55 nm of Sample A and 46 nm of Sample B in Examples. On the other hand, PV value, which is an index of the optical flatness in this invention calculated by difference shape between the virtual reference surface and the principal surface actually measured in a circular region of 104 mm diameter, was 30 nm in Sample X1 and 26 nm in Sample X3 of Comparative Examples, both Samples X1 and X3 of Comparative Examples not satisfying 25 nm which is λ/8 of exposure wavelength λ of ArF exposure. Further, there is no correlation between the degree of TIR showing mechanical flatness and the degree of optical flatness, and it was found that to obtain an extremely high flatness of λ/8, selecting and obtaining by the optical flatness of this invention is extremely effective.

The mechanical flatness of Sample Y of Comparative Examples was, as represented by TIR, 441 nm in the case of 146 mm×146 mm region, and 107 nm in the case of 132 mm×132 mm region. The TIR value 107 nm of Sample Y of Comparative Examples in 132 mm×132 mm region was superior to Sample D of Examples. Further, in the case of a circular region of 90 mm diameter, the value was 51 nm. The value 51 nm in Sample Y of Comparative Examples is also superior to 63 nm in Sample D of Examples. On the other hand, PV value, which is an index of the optical flatness in this invention calculated by difference shape between the virtual reference surface and the principal surface actually measured in a circular region of 90 mm diameter, was 36 nm in Sample Y of Comparative Examples, not satisfying 25 nm which is λ/8 of exposure wavelength λ of ArF exposure. Further, there is no correlation between the degree of TIR showing mechanical flatness and the degree of optical flatness, and it was found that to obtain an extremely high flatness of λ/8, selecting and obtaining by the optical flatness of this invention is extremely effective.

Reference Example 1

The mechanical flatness of Sample C of Reference Examples was, as represented by TIR, 346 nm in the case of 146 mm×146 mm region; 281 nm in the case of 132 mm×132 mm region; and 81 nm in the case of a circular region of 104 mm diameter. The values are the greatest among the eight samples. Particularly in 132 mm×132 mm region within which a transfer exposure region (shot region) fits, the value was beyond 200 nm (0.2 μm). On the other hand, the optical flatness in this invention calculated by difference shape between the virtual reference surface and the principal surface actually measured in a circular region of 104 mm diameter was 13 nm as represented by PV value, the value being extremely favorable which is approximately half of 25 nm which is λ/8 of exposure wavelength λ of ArF exposure. A mask was manufactured using this mask blank substrate and transfer evaluation was made using a scanner, resulting in excellent focus latitude, positional displacement, and resolution similar to Examples in the center of the shot, but was lower in the periphery.

Reference Example 2

The mechanical flatness of Sample X2 of Reference Examples was, in TIR, 126 nm in the case of 146 mm×146 mm region; 81 nm in the case of 132 mm×132 mm region; and 29 nm in the case of a circular region of 104 mm diameter. These are small values as in Sample X1 of Comparative Examples. On the other hand, the optical flatness of this invention calculated by the difference shape between the virtual reference surface and the principal surface actually measured in the circular region of 104 mm diameter was 19 nm in PV value, which was a favorable value of 25 nm or less which is λ/8 of exposure wavelength λ of ArF exposure. However, the determination coefficient $R^2$ was as small as 0.637, and divergence in fitting with the optically flat surface (virtual reference surface) in the entire circular region of 104 mm diameter was conspicuous.

[Manufacture of Mask Blank]

An example of the manufacture of a halftone type mask blank is given below. First, mask blank substrates manufactured by the above method and satisfied the selection reference (Samples A, B, D of Examples) are prepared, and light-semitransmissive films made of nitrided molybdenum and silicon were formed thereon. Concretely, a MoSiN film including molybdenum, silicon, and nitrogen was formed at a film thickness of 69 nm using a mixed target of molybdenum (Mo) and silicon (Si) (Mo:Si=10 mol %:90 mol %), under a mixed gas atmosphere of argon (Ar), nitrogen ($N_2$), and helium (He) (gas flow ratio Ar:$N_2$:He=5:49:46), with 0.3 Pa gas pressure and 3.0 kW electric power of DC power source, by reactive sputtering (DC sputtering). Next, the substrate with MoSiN film formed thereon was heated using a heating furnace under the condition of 450° C. heating temperature within the atmosphere for one hour. The MoSiN film had 6.16% transmittance and 184.4 degree phase difference in ArF excimer laser.

Next, a light shielding film was formed on the light-semitransmissive film. Concretely, CrOCN layer with a film thickness of 30 nm was formed using chromium (Cr) target as a sputtering target, under a mixed gas atmosphere of argon (Ar), carbon dioxide ($CO_2$), nitrogen ($N_2$), and helium (He) (0.2 Pa gas pressure, gas flow ratio Ar:$CO_2$:$N_2$:He=20:35:10:30) with 1.7 kW electric power of DC power source, by reactive sputtering (DC sputtering). Subsequently, CrN layer having a film thickness of 4 nm was formed under a mixed gas atmosphere of argon (Ar) and nitrogen ($N_2$) (0.1 Pa gas pressure, gas flow ratio Ar:$N_2$=25:5), with 1.7 kW electric power of DC power source, by reactive sputtering (DC sputtering). Finally, CrOCN layer with a film thickness of 14 nm was formed under a mixed gas atmosphere of argon (Ar), carbon dioxide ($CO_2$), nitrogen ($N_2$), and helium (He)

(0.2 Pa gas pressure, gas flow ratio $Ar:CO_2:N_2:He=20:35:5:30$), with 1.7 kW electric power of DC power source, by reactive sputtering (DC sputtering). Thus, a chromium based light shielding film of a three layer laminated structure with a total film thickness of 48 nm was formed. Thereafter, heat treatment was conducted at 280° C. for 15 minutes, and film stress was reduced to approximately 0.

The surface flatness of the mask blank manufactured by this method achieved a value of 25 nm or less which is $\lambda/8$ of exposure wavelength $\lambda$ (193 nm) of ArF exposure, creating a mask blank with sufficient wavefront control of $\lambda/8$.

In the manufacturing method of the mask blank given above, flatness of the mask blank substrate was measured, data of the difference shape with the virtual reference surface was obtained, selection on the optical flatness was made, and thereafter a thin film was formed to manufacture the mask blank. However, the order of forming the thin film and selecting the optical flatness can be replaced. Namely, the steps can be carried out such that a thin film is formed on the mask blank substrate, flatness of the mask blank is measured, difference shape data with the virtual reference surface is obtained, and selection of the optical flatness is made.

[Manufacture of Transfer Mask and Manufacture of Semiconductor Device]

A pattern was formed on a thin film of a mask blank manufactured by the method mentioned above to manufacture a transfer mask. The manufacturing process of the transfer mask is identical to the method given above in [Transfer Mask and its Manufacturing Method], the explanation of which is omitted.

The optical flatness of a transfer primary face of the transfer mask manufactured by this method is extremely high as one-eighth or less of exposure wavelength $\lambda$, allowing the manufacture of a transfer mask with sufficient wavefront control. Due to the sufficient wavefront control, when exposed using this transfer mask, excellent focal depth, inhibition of positional displacement, and resolution were achieved, also stabilizing circuit characteristics of a semiconductor device manufactured using the same.

In the mask blank substrate and the mask blank of this invention, considering a load on the aberration correction function in an exposure apparatus, the surface shape in the case of using an aberration correction function where the order of a Zernike polynomial is the term of second or lower order is $\lambda/8$ or less. However, in the case where applying more load on wavefront aberration correction related to the surface shape of a substrate or a mask blank has less influence on exposing and transferring due to improvement in the performance of aberration correction function of an exposure apparatus and improvement of quality of a projection lens, the range of the virtual reference surface can be extended to a surface shape defined by a Zernike polynomial which is composed of only terms in which the order of a variable related to a radius is the third or lower order, and includes one or more terms in which the order of the variable related to the deformation is the third order. By using the surface shape defined by the above Zernike polynomial as the virtual reference surface, yield in manufacturing the mask blank substrate and the mask blank of this invention can be enhanced significantly.

REFERENCE NUMERALS 1 mask blank substrate
2 mechanically flat surface
3 substrate principal surface
4 optically flat surface
21 mask blank substrate
22 light shielding film pattern
23 exposure light
24 pattern opening
25 field portion
26 light-semitransmissive pattern
31 light source
32 exposure light
33 illumination optical system
34 mask
35 projection lens
36 pupil
37 phase filter
38 projection lens
39 wafer stage
40 wafer
41 illumination portion
42 light shielding portion
43 illumination portion
44 light shielding portion
45 resist pattern
46 illumination portion
47 light shielding portion
48 resist pattern
51a pattern opening
51b opening
52a light-semitransmissive portion
52b resist pattern
53 recess
55a pattern opening
55b opening
56a light-semitransmissive portion
56b resist portion
57 recess
60 wafer

The invention claimed is:

1. A mask blank substrate for use in manufacturing a mask blank provided with a thin film for forming a transfer pattern on one of a pair of opposing principal surfaces of a transparent substrate,
wherein the principal surface to which the thin film is provided has a surface shape of which, in a case where a shape fitting on a virtual reference surface is carried out and difference data between the principal surface and the virtual reference surface is obtained in a calculation region within an inner side of a circle of 104 mm diameter based on a center of a substrate, a difference between a maximum height and a minimum height within the calculation region of the difference data is $\lambda/8$ or less, provided that an exposure wavelength used for transfer is $\lambda$, and
wherein the virtual reference surface has a shape defined by a Zernike polynomial expressed by a polar coordinate system, which is composed of only terms in which an order of a variable related to a radius is a second or lower order, and includes one or more terms in which an order of a variable related to a radius is a second order.

2. The mask blank substrate according to claim 1, wherein a determination coefficient $R^2$ calculated from the difference data is 0.9 or more.

3. The mask blank substrate according to claim 1, wherein the principal surface to which the thin film is provided has a flatness of 0.2 μm or less in an inner region of a square shape with a side of 132 mm based on a center of a substrate.

4. A mask blank comprising the thin film on one of the principal surfaces of the mask blank substrate according to claim 1.

5. A transfer mask comprising a transfer pattern formed on the thin film of the mask blank according to claim 4.

6. The transfer mask according to claim 5, wherein the transfer mask is placed on a mask stage of an exposure apparatus and is used for exposure and transfer upon a transfer object on a semiconductor substrate, the exposure apparatus having a function to correct a shape of a wavefront of a light, which transmitted from the transfer pattern of the transfer mask, in a shape defined by a Zernike polynomial.

7. A method of manufacturing a semiconductor device comprising placing the transfer mask of claim 5 on a mask stage of an exposure apparatus and transferring a transfer pattern of the transfer mask on a semiconductor substrate by a lithography method.

8. The method of manufacturing a semiconductor device according to claim 7, wherein the exposure apparatus has a function to correct a shape of a wavefront of a light, which transmitted from the transfer pattern of the transfer mask, in a shape defined by a Zernike polynomial.

9. A mask blank substrate for use in manufacturing a mask blank provided with a thin film for forming a transfer pattern on one of a pair of opposing principal surfaces of a transparent substrate,
wherein the principal surface to which the thin film is provided has a surface shape of which, in a case where a shape fitting on a virtual reference surface is carried out and difference data between the principal surface and the virtual reference surface is obtained in a calculation region within an inner side of a circle of 90 mm diameter based on a center of a substrate, a difference between a maximum height and a minimum height within the calculation region of the difference data is $\lambda/8$ or less, provided that an exposure wavelength used for transfer is $\lambda$, and
wherein the virtual reference surface has a shape defined by a Zernike polynomial expressed by a polar coordinate system, which is composed of only terms in which an order of a variable related to a radius is a second or lower order, and includes one or more terms in which an order of a variable related to a radius is a second order.

10. The mask blank substrate according to claim 9, wherein a determination coefficient $R^2$ calculated from the difference data is 0.9 or more.

11. The mask blank substrate according to claim 9, wherein the principal surface to which the thin film is provided has a flatness of 0.2 μm or less in an inner region of a square shape with a side of 132 mm based on a center of a substrate.

12. A mask blank comprising the thin film on one of the principal surfaces of the mask blank substrate according to claim 9.

13. A mask blank provided with a thin film for forming a transfer pattern on one of a pair of opposing principal surfaces of a transparent substrate,
wherein a surface of the thin film has a surface shape of which, in a case where a shape fitting on a virtual reference surface is carried out and difference data between the principal surface and the virtual reference surface is obtained in a calculation region within an inner side of a circle of 104 mm diameter based on a center of a substrate, a difference between a maximum height and a minimum height within the calculation region of the difference data is $\lambda/8$ or less, provided that an exposure wavelength used for transfer is $\lambda$, and
wherein the virtual reference surface has a shape defined by a Zernike polynomial expressed by a polar coordinate system, which is composed of only terms in which an order of a variable related to a radius is a second or lower order, and includes one or more terms in which an order of a variable related to a radius is a second order.

14. The mask blank according to claim 13, wherein a determination coefficient $R^2$ calculated from the difference data is 0.9 or more.

15. The mask blank according to claim 13, wherein a surface of the thin film has a flatness of 0.2 μm or less in an inner region of a square shape with a side of 132 mm based on a center of a substrate.

16. A transfer mask comprising a transfer pattern formed on the thin film of the mask blank according to claim 13.

17. The transfer mask according to claim 16, wherein the transfer mask is placed on a mask stage of an exposure apparatus and is used for exposure and transfer upon a transfer object on a semiconductor substrate, the exposure apparatus having a function to correct a shape of a wavefront of a light, which transmitted from the transfer pattern of the transfer mask, in a shape defined by a Zernike polynomial.

18. A method of manufacturing a semiconductor device comprising placing the transfer mask of claim 16 on a mask stage of an exposure apparatus and transferring a transfer pattern of the transfer mask on a semiconductor substrate by a lithography method.

19. The method of manufacturing a semiconductor device according to claim 18, wherein the exposure apparatus has a function to correct a shape of a wavefront of a light, which transmitted from the transfer pattern of the transfer mask, in a shape defined by a Zernike polynomial.

20. A mask blank provided with a thin film for forming a transfer pattern on one of a pair of opposing principal surfaces of a transparent substrate,
wherein a surface of the thin film has a surface shape of which, in a case where a shape fitting on a virtual reference surface is carried out and difference data between the principal surface and the virtual reference surface is obtained in a calculation region within an inner side of a circle of 90 mm diameter based on a center of a substrate, a difference between a maximum height and a minimum height within the calculation region of the difference data is $\lambda/8$ or less, provided that an exposure wavelength used for transfer is $\lambda$, and
wherein the virtual reference surface has a shape defined by a Zernike polynomial expressed by a polar coordinate system, which is composed of only terms in which an order of a variable related to a radius is a second or lower order, and includes one or more terms in which an order of a variable related to a radius is a second order.

21. The mask blank according to claim 20, wherein a determination coefficient $R^2$ calculated from the difference data is 0.9 or more.

22. The mask blank according to claim 20, wherein a surface of the thin film has a flatness of 0.2 μm or less in an inner region of a square shape with a side of 132 mm based on a center of a substrate.

23. A transfer mask comprising a transfer pattern formed on the thin film of the mask blank according to claim 20.

24. The transfer mask according to claim 23, wherein the transfer mask is placed on a mask stage of an exposure apparatus and is used for exposure and transfer upon a transfer object on a semiconductor substrate, the exposure apparatus having a function to correct a shape of a wavefront of a light, which transmitted from the transfer pattern of the transfer mask, in a shape defined by a Zernike polynomial.

25. A method of manufacturing a semiconductor device comprising placing the transfer mask of claim 23 on a mask stage of an exposure apparatus and transferring a transfer pattern of the transfer mask on a semiconductor substrate by a lithography method.

26. The method of manufacturing a semiconductor device according to claim 25, wherein the exposure apparatus has a function to correct a shape of a wavefront of a light, which transmitted from the transfer pattern of the transfer mask, in a shape defined by a Zernike polynomial.

* * * * *